US012660452B2

(12) United States Patent
Bang et al.

(10) Patent No.: US 12,660,452 B2
(45) Date of Patent: *Jun. 16, 2026

(54) DISPLAY DEVICE

(71) Applicant: Samsung Display Co., LTD., Yongin-si (KR)

(72) Inventors: Ki Ho Bang, Hwaseong-si (KR); Seung Hwan Cho, Yongin-si (KR); Won Suk Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 19/023,878

(22) Filed: Jan. 16, 2025

(65) Prior Publication Data

US 2025/0169307 A1     May 22, 2025

Related U.S. Application Data

(63) Continuation of application No. 17/496,872, filed on Oct. 8, 2021, now Pat. No. 12,238,987.

(30) Foreign Application Priority Data

Apr. 5, 2021     (KR) ........................ 10-2021-0043727

(51) Int. Cl.
  *G06F 3/041*     (2006.01)
  *H10K 59/131*    (2023.01)
       (Continued)
(52) U.S. Cl.
  CPC ......... *H10K 59/131* (2023.02); *G06F 3/0412* (2013.01); *H10K 59/40* (2023.02); *H10K 77/111* (2023.02); *H10K 2102/311* (2023.02)

(58) Field of Classification Search
  None
  See application file for complete search history.

(56) References Cited

U.S. PATENT DOCUMENTS 11,355,526 B2    6/2022   Park et al.
11,424,313 B2    8/2022   Kim et al.
        (Continued)

FOREIGN PATENT DOCUMENTS

KR        20200066499 A      6/2020
KR        20210033580 A      3/2021

OTHER PUBLICATIONS

PTO-0892 Notice(s) of References Cited (1 page) and PTO-1449 Notice(s) indicating references considered (8 pages), in related (parent) U.S. Appl. No. 17/496,872.

*Primary Examiner* — Brian M Butcher
(74) *Attorney, Agent, or Firm* — CANTOR COLBURN LLP

(57)              ABSTRACT

An electronic device includes a display panel, where the display panel includes a display area having a pixel, a non-display area, and a non-display sub-region including a first area and a bending area, along a first direction, and a first power line which is in the non-display area and the first area, transmits a power voltage to the pixel, and includes a first and a second power connection portion spaced apart from each other in the first direction, and first and second power path portions which are spaced apart from each other along a second direction and connect the first and second power connection portions to each other. The length of the non-display sub-region is smaller than the length of the non-display area, and the first power path portion is closer to the outer edge of the non-display sub-region than the second power path portion.

20 Claims, 29 Drawing Sheets

ACUR: ACUR1, ACUR2
VSL: VSC1, VSC2, VPC1, VPC2

(51) Int. Cl.
  H10K 59/40      (2023.01)
  *H10K 77/10*      (2023.01)
  *H10K 102/00*      (2023.01)

(56)                References Cited

U.S. PATENT DOCUMENTS

| | | | |
|---|---|---|---|
| 11,910,677 | B2 | 2/2024 | Kim et al. |
| 11,935,903 | B2 | 3/2024 | Park et al. |
| 12,238,987 | B2 * | 2/2025 | Bang .................... H10D 86/441 |
| 12,342,698 | B2 | 6/2025 | Kim et al. |
| 2020/0312922 | A1 * | 10/2020 | Hack .................... H10K 59/351 |
| 2025/0287804 | A1 | 9/2025 | Kim et al. |

* cited by examiner

FIG. 9

ACUR: ACUR1, ACUR2
VSL: VSC1, VSC2, VPC1, VPC2

VSL: VSC1, VSC2, VPC1, VPC2, VPC3

DISPLAY DEVICE

This application is a continuation application of U.S. application Ser. No. 17/496,872 filed Oct. 8, 2021, which claims priority to Korean Patent Application No. 10-2021-0043727 filed on Apr. 5, 2021, and all the benefits accruing therefrom under 35 U.S.C. § 119, the content of which in its entirety is herein incorporated by reference.

BACKGROUND

1. Field

Embodiments of the invention relate to a display device.

2. Description of the Related Art

With the advance of an information-oriented society, more and more demands are placed on display devices for displaying images in various ways. For example, display devices are employed in various electronic devices such as smartphones, digital cameras, laptop computers, navigation devices, and smart televisions.

The display device may be a flat panel display device such as a liquid crystal display device, a field emission display device and a light emitting display device. Examples of the light emitting display device include an organic light emitting display device composed of organic light emitting elements, an inorganic light emitting display device composed of inorganic light emitting elements such as inorganic semiconductors, and a micro light emitting display device composed of micro light emitting elements.

SUMMARY

In the display device, a non-display area (or bezel area) except for a display area is minimized to enlarge the display area where pixels or light emission portions for displaying images are disposed. As the non-display area (or bezel area) is minimized, the width of a power line in the non-display area (or bezel area) may be reduced. In such a case, since electrical resistance in the power line increases and an electric current is concentrated in a bottle-neck portion of the power line, heat may be generated in the power line. As a result, there arises a likelihood that pixels adjacent to the power line may be degraded by the heat of the power line.

Embodiments of the invention provide a display device capable of reducing heat generation in a bottle-neck portion of a power line.

An embodiment of the invention provides a display device including a substrate including a main region including a display area including scan lines, data lines and pixels, and a non-display area adjacent to the display area, and a sub-region including a first area adjacent to the non-display area and a bending area adjacent to the first area, a first power line in the non-display area and the first area of the substrate and to which a first power voltage is applied, and first power connection lines in the bending area of the substrate. The first power line includes a first power connection portion in the non-display area, a second power connection portion connected to the first power connection lines, and a first power path portion and a second power path portion between the first power connection portion and the second power connection portion. A length of the sub-region in a first direction is smaller than a length of the main region in the first direction. The first power path portion is closer to an edge of the sub-region than the second power path portion.

A width of the first power path portion may be greater than a width of the second power path portion.

The display device may further include first display power lines in the display area of the substrate. The first power connection portion may extend in the first direction, and the first display power lines may extend in a second direction crossing the first direction.

The display device may further include touch electrodes in the display area of the substrate, and a scan driver in the non-display area of the substrate and configured to apply scan signals to the scan lines. A first touch line area including first touch lines connected to first touch electrodes among the touch electrodes, a scan fan-out area including scan fan-out lines connected to the scan driver, and a second touch line area including second touch lines connected to second touch electrodes among the touch electrodes may be between the first power path portion and the second power path portion in the first direction.

The scan fan-out area may be between the first touch line area and the second touch line area in the first direction.

The first touch line area may be adjacent to the first power path portion, and the second touch line area may be adjacent to the second power path portion.

The display device may further include a second power line in the non-display area and the first area of the substrate and to which a second power voltage different from the first power voltage is applied. A data fan-out area including data fan-out lines connected to the data lines may be between the second power path portion and the second power line in the first direction.

The first power line may further include a third power path portion between the first power connection portion and the second power connection portion. A width of the first power path portion, a width of the second power path portion, and a width of the third power path portion may be different from each other.

A width of the first power path portion may be greater than a width of the second power path portion, and a width of the second power path portion may be greater than a width of the third power path portion.

The first power path portion may be closer to an edge of the substrate than the second power path portion is, and the second power path portion may be closer to the edge of the substrate than the third power path portion.

A distance between the first power path portion and the second power path portion in the first direction may be smaller than a distance between the second power path portion and the third power path portion in the first direction.

The display device may further include touch electrodes in the display area of the substrate, and a scan driver in the non-display area of the substrate and configured to apply scan signals to the scan lines. A first touch line area including first touch lines connected to some touch electrodes among the touch electrodes, and a scan fan-out area including scan fan-out lines connected to the scan driver may be between the first power path portion and the second power path portion in the first direction.

A second touch line area including second touch lines connected to some other touch electrodes among the touch electrodes may be between the second power path portion and the third power path portion in the first direction.

Each of the pixels may include a first active layer of a thin film transistor on the substrate, a first insulating layer on the first active layer, a first gate electrode of the thin film transistor on the first insulating layer, a second insulating layer on the first gate electrode, and a first anode connection electrode on the second insulating layer and electrically connected to the thin film transistor.

The first power line may be on the second insulating layer, and may include the same material as the first anode connection electrode.

The display device may further include a first organic layer on the first anode connection electrode and the first power line, a second anode connection electrode on the first organic layer and connected to the first anode connection electrode, and a second organic layer on the second anode connection electrode. The first power connection lines may be on the second organic layer.

An embodiment of the invention provides a display device including scan lines extending in a first direction, data lines extending in a second direction crossing the first direction, pixels respectively connected to the scan lines and the data lines corresponding thereto, a scan driving circuit configured to supply scan signals to the scan lines, scan fan-out lines connected to the scan driving circuit, and a first power line to which the first power voltage is applied. The first power line includes a first power connection portion and a second power connection portion, and a first power path portion and a second power path portion between the first power connection portion and the second power connection portion. The scan fan-out lines is in a first spacing portion between the first power path portion and the second power path portion.

The display device may further include data fan-out lines connected to the data lines. The first power line may not overlap the data fan-out lines.

The display device may further include touch electrodes on the pixels, and touch lines connected to the touch electrodes. The touch lines may be in the first spacing portion.

An embodiment of the invention provides a display device including a substrate including a main region including a display area including pixels and a non-display area adjacent to the display area, and a sub-region including a first area adjacent to the non-display area and a bending area adjacent to the first area, and a first power line in the non-display area and the first area of the substrate and to which a first power voltage is applied. The first power line includes a first power connection portion and a second power connection portion, and a first power path portion and a second power path portion between the first power connection portion and the second power connection portion. The first power path portion is closer to an edge of the substrate than the second power path portion. A width of the first power path portion is greater than a width of the second power path portion.

According to one or more embodiment, the power line includes a plurality of power path portions. Since a first power path portion, among the plurality of power path portions, is adjacent to the edge of a sub-region, an electric current concentrated in a current concentration area of a first power line can be made to flow to a second power connection portion through the first power path portion. Thus, the area of the current concentration area of the first power line can be reduced. Accordingly, since the amount of heat generated in the current concentration area of the first power line can be reduced, degradation of pixels in a display area adjacent to the first power line can be reduced.

BRIEF DESCRIPTION OF THE DRAWINGS

These and/or other features of the invention will become apparent and more readily appreciated from the following description of the embodiments, taken in conjunction with the accompanying drawings, in which:

FIG. 9 is a plan view showing an embodiment of a first power line of area B-1 of FIG. 8;

DETAILED DESCRIPTION

Figure 1:
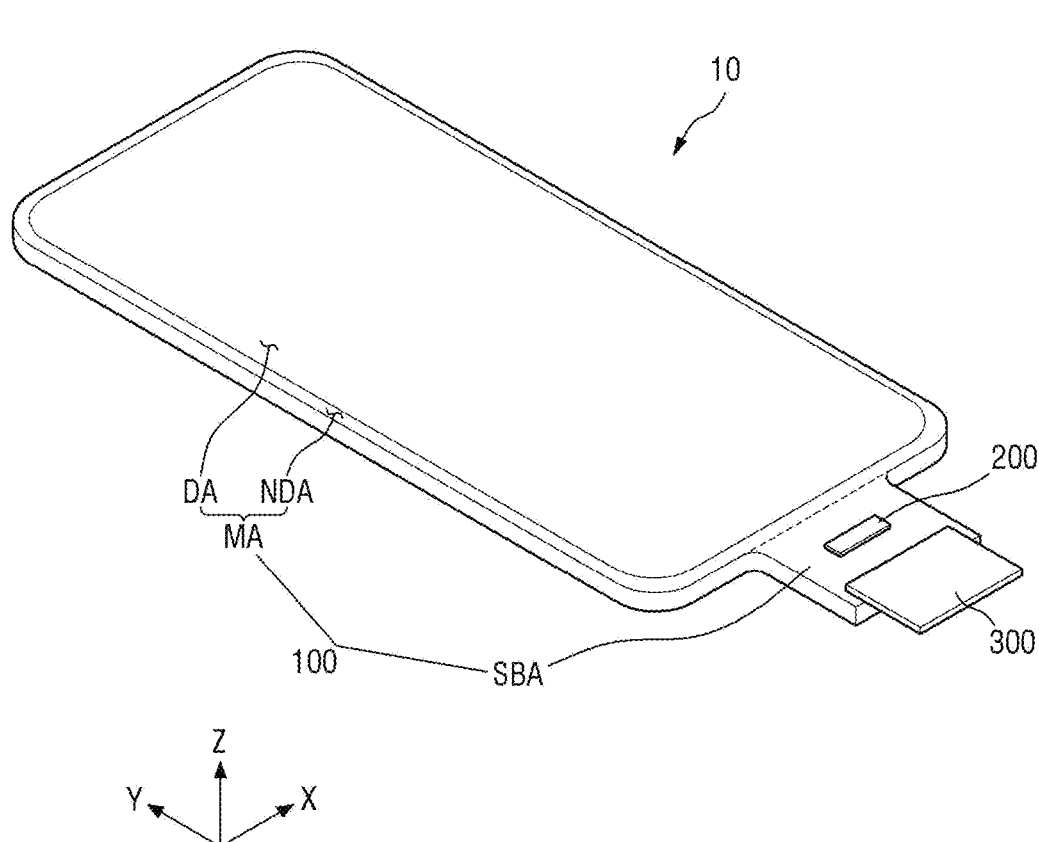
FIG. 1 is a perspective view illustrating an embodiment of a display device.

Embodiments of the invention will now be described more fully hereinafter with reference to the accompanying drawings, in which embodiments of the invention are shown. The invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification. In the attached drawing figures, the thickness of layers and regions is exaggerated for clarity. As used herein, a same reference number may indicate a singular element or a plurality of the element. For example, a reference number labeling a singular form of an element within the drawing figures may be used to reference a plurality of the element within the text of specification.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will also be understood that when a layer is referred to as being related to another element such as being "on" another layer or substrate, it can be directly on the other layer or substrate, or intervening layers may also be present. In contrast, when an element is referred to as being related to another element such as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. A region illustrated or described as flat may, typically, have rough and/or nonlinear features, for example. Moreover, sharp angles that are illustrated may be rounded. Thus, the regions illustrated in the drawing figures are schematic in nature and their shapes are not intended to illustrate the precise shape of a region and are not intended to limit the scope of the claims.

Hereinafter, embodiments of the invention will be described in detail with reference to the accompanying drawings.

FIG. 1 is a perspective view illustrating an embodiment of a display device 10.

Referring to FIG. 1, a display device 10 is a device for displaying a moving image or a still image. The display device 10 may be used as a display screen of various devices, such as a television, a laptop computer, a monitor, a billboard and an Internet-of-Things (IOT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

The display device 10 may be a light emitting display device such as an organic light emitting display using an organic light emitting diode, a quantum dot light emitting display including a quantum dot light emitting layer, an inorganic light emitting display including an inorganic semiconductor, and a micro light emitting display using a micro or nano light emitting diode (LED). In the following description, it is assumed that the display device 10 is an organic light emitting display device, but the present disclosure is not limited thereto.

The display device 10 includes a display panel 100, a display driving circuit 200, and a circuit board 300.

The display panel 100 may be formed in a rectangular shape, in a plan view, having short sides extended along or in a first direction (X-axis direction) and long sides extended along or in a second direction (Y-axis direction) which crosses the first direction (X-axis direction). The corner where the short side in the first direction (X-axis direction) and the long side in the second direction (Y-axis direction) meet may be rounded to have a predetermined curvature or may be right-angled. The planar shape of the display panel 100 is not limited to the rectangular shape, and may be provided or formed in another polygonal shape, a circular shape or an elliptical shape. The display panel 100 may be formed to be flat, but is not limited thereto. In an embodiment, for example, the display panel 100 may include a curved portion formed at left and right ends along the first direction and having a predetermined curvature or a varying curvature. In addition, the display panel 100 may be formed flexibly so that the display panel 100 is curvable, bendable, rollable or rollable.

The display panel 100 may include a main region MA and a sub-region SBA. Various layers and elements of the display device 10 may include a main region MA and a sub-region SBA corresponding to those described above. In an embodiment, a substrate of the display panel 100 may include a main region MA and a sub-region SBA.

The main region MA may include a display area DA displaying an image and a non-display area NDA that is a peripheral area of the display area DA. The display area DA may include pixels PX (see FIG. 5A) for displaying an image. The sub-region SBA may protrude in the second direction (Y-axis direction) from a side of the main region MA. The sub-region SBA may be a non-display sub-region and form a part of the non-display area NDA, without being limited thereto.

Although it is exemplarily shown in FIG. 1 that the sub-region SBA is unfolded or flat, the sub-region SBA may be bendable. The display device 10 which is bent may dispose the sub-region SBA bent and arranged on the bottom surface of the display panel 100. In the case where the sub-region SBA is bent, the sub-region SBA may overlap the main region MA along or in the thickness direction as a third direction (Z-axis direction) of the substrate. The display driving circuit 200 may be arranged in the sub-region SBA.

The display driving circuit 200 may generate signals and voltages for driving the display panel 100. The display driving circuit 200 may be formed as an integrated circuit (IC) and attached onto the display panel 100 by a chip on glass (COG) method, a chip on plastic (COP) method, or an ultrasonic bonding method, but the present disclosure is not limited thereto. In an embodiment, for example, the display driving circuit 200 may be attached onto the circuit board 300 by a chip on film (COF) method.

The circuit board 300 may be attached to the display panel 100 at an end of the sub-region SBA of the display panel 100. Thus, the circuit board 300 may be electrically connected to the display panel 100 and the display driving circuit 200. The display panel 100 and the display driving circuit 200 may receive digital video data, timing signals, and driving voltages through the circuit board 300. The circuit board 300 may be a flexible printed circuit board, a printed circuit board, or a flexible film such as a chip on film.

Figure 2:
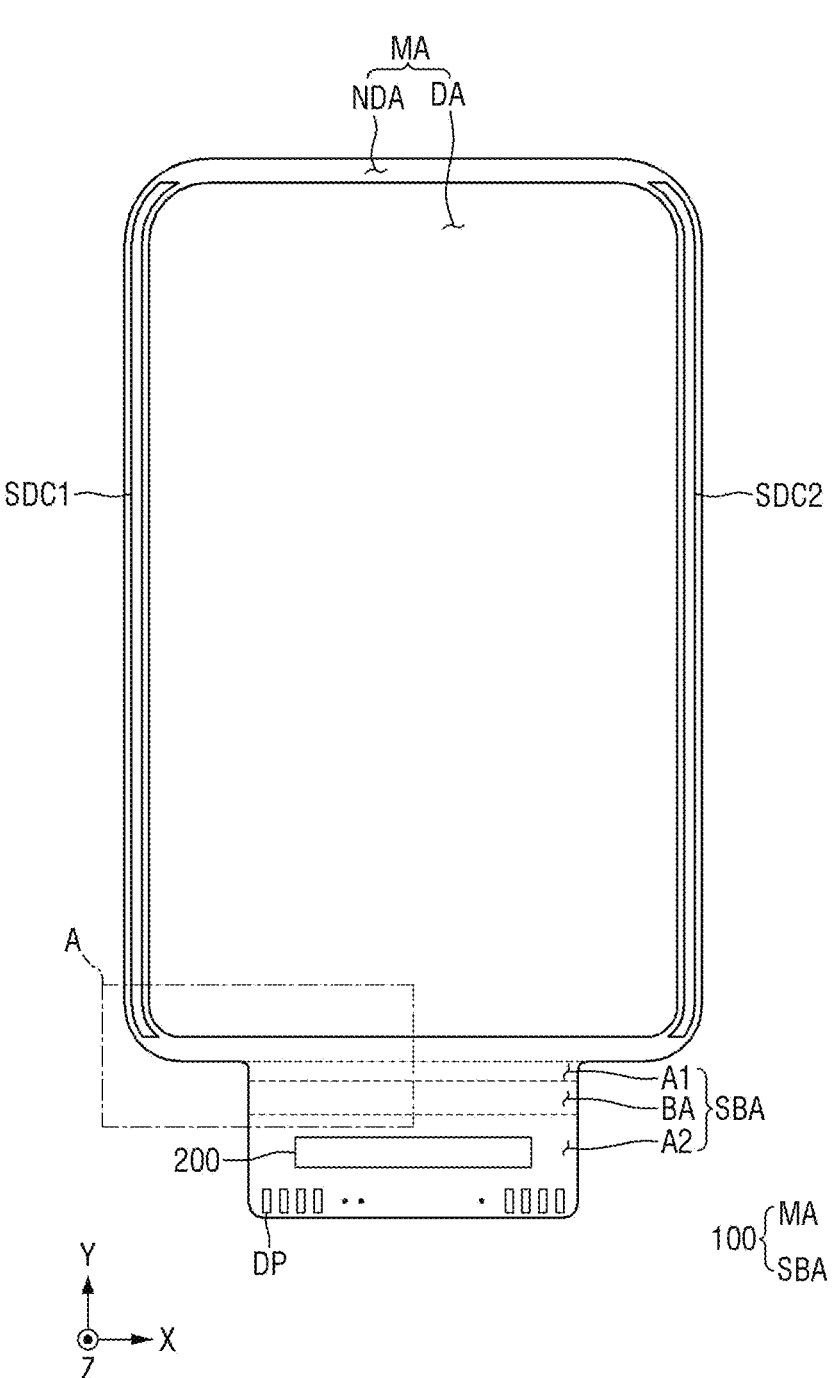
FIGS. 2 and 3 are plan views illustrating an embodiment of a display device.
Figure 3:
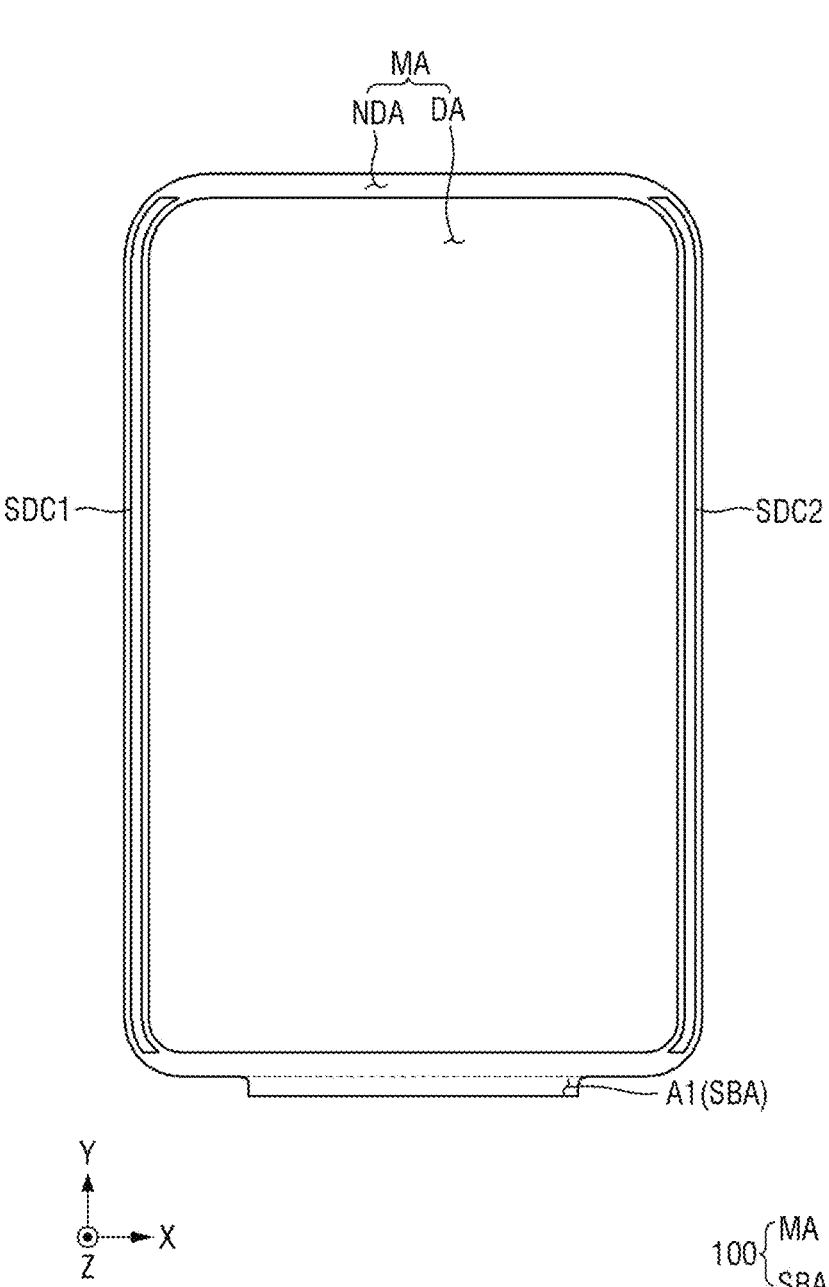
Figure 4:
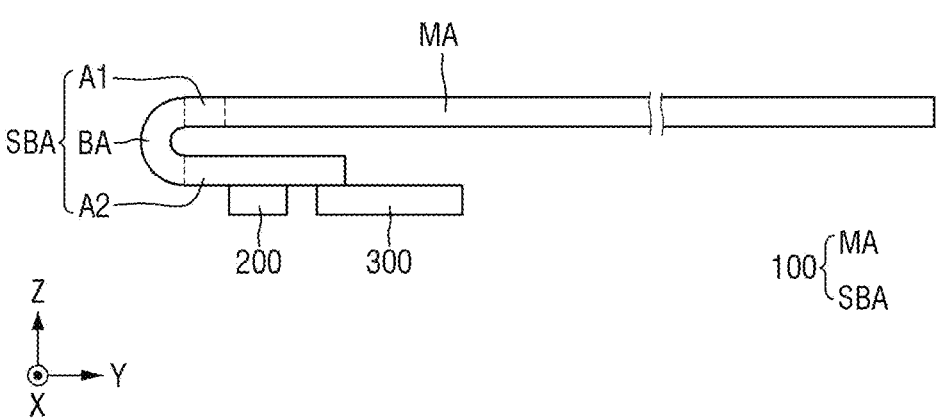
FIG. 4 is a side view illustrating an embodiment of a display device.

FIGS. 2 and 3 are plan views illustrating an embodiment of a display device 10. FIG. 4 is a side view illustrating an embodiment of a display device 10.

It is exemplarily shown in FIG. 2 that the sub-region SBA is unfolded or flat without being bent. It is exemplarily shown in FIGS. 3 and 4 that the sub-region SBA is bent.

Referring to FIGS. 2 to 4, the display panel 100 may include the main region MA and the sub-region SBA.

The main region MA may include a display area DA displaying an image and a non-display area NDA that is a peripheral area of the display area DA. The display area DA may occupy most of the main region MA. The display area DA may be disposed at the center of the main region MA or spaced apart from an outer edge of the display panel 100.

The non-display area NDA may be disposed adjacent to the display area DA. The non-display area NDA may be an area outside the display area DA. The non-display area NDA may be disposed to surround the display area DA. The non-display area NDA may be an edge area of the display area DA and may define the outer edge of the display panel 100 without being limited thereto.

A first scan driver SDC1 and a second scan driver SDC2 may be disposed in the non-display area NDA. The first scan driver SDC1 may be disposed at one side (for example, left side) of the display panel 100, and the second scan driver SDC2 may be disposed at the other side (for example, right side) of the display panel 100, but the present disclosure is not limited thereto. Each of the first scan driver SDC1 and the second scan driver SDC2 may be electrically connected to the display driving circuit 200 via scan fan-out lines SFL (see FIG. 13), scan connection lines SCL (see FIG. 13), and scan pad lines SPL (see FIG. 13). Each of the first scan driver SDC1 and the second scan driver SDC2 may receive scan timing signals inputted from the display driving circuit 200, generate scan signals in response to the scan timing signals, and output the generated scan signals to scan lines.

The sub-region SBA may protrude in the second direction (Y-axis direction) from one side of the main region MA. The length of the sub-region SBA in the second direction (Y-axis direction) may be less than the length of the main region MA in the second direction (Y-axis direction). The length of the sub-region SBA in the first direction (X-axis direction) may be substantially equal to or less than the length of the main region MA in the first direction (X-axis direction). The sub-region SBA may be bendable so as to dispose a portion of the sub-region SBA on the bottom surface of the display panel 100. In this case, the sub-region SBA may overlap the main region MA in the third direction (Z-axis direction).

The sub-region SBA may include a first area A1, a second area A2, and a bending area BA.

The first area A1 is a region protruding from one side of the main region MA in the second direction (Y-axis direction). A first side of the first area A1 may be in contact with the non-display area NDA of the main region MA, and a second side which opposes the first side of the first region A1 may be in contact with the bending area BA.

The second area A2 is a planar area at which display pads DP and the display driving circuit 200 are disposed. The display driving circuit 200 may be attached to driving pads of the second area A2 using a low-resistance high-reliability material such as self-assembly anisotropic conductive paste (SAP) or an anisotropic conductive film. The circuit board 300 may be attached to the display pads DP of the display panel 100 at the second area A2 using a low-resistance high-reliability material such as SAP or an anisotropic conductive film. One side of the second area A2 may be in contact with the bending area BA.

The bending area BA is a planar area at which the display panel 100 and various layers or elements thereof area bendable. Referring to FIGS. 3 and 4, the display panel 100 which is bent at the bending area BA is bent may dispose the second area A2 under the first area A1 and under the main region MA. The bending area BA may be disposed between the first area A1 and the second area A2 in a direction along the display panel 100. A first side of the bending area BA may be in contact with the first area A1, and a second side which opposes the first side of the bending area BA may be in contact with the second area A2. As being in contact, elements may form an interface or boundary therebetween, without being limited thereto.

Figure 5A:
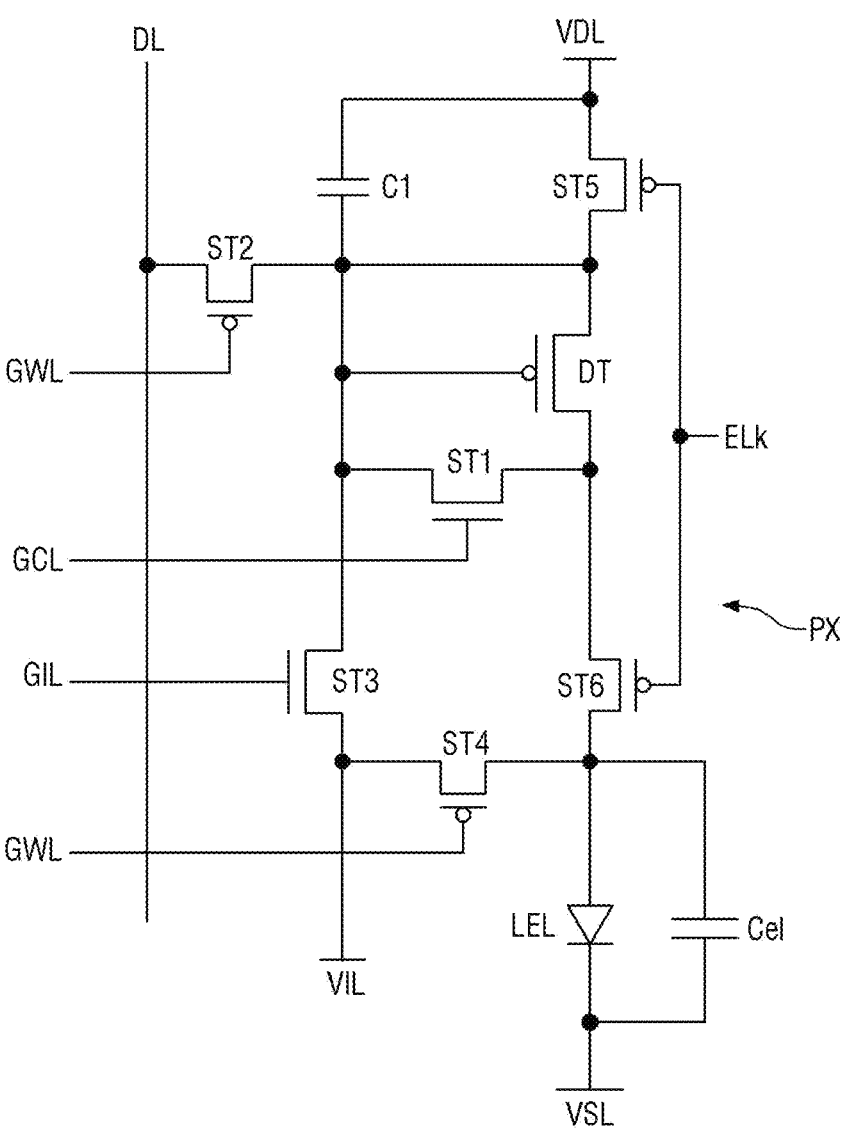
FIG. 5A is a circuit diagram illustrating an embodiment of a pixel in a display area of a display panel.

FIG. 5A is a circuit diagram illustrating an embodiment of a pixel PX in a display area DA of a display panel 100.

Referring to FIG. 5A, each pixel PX may be connected to any two among a plurality of scan lines, any one emission line Elk among a plurality of emission lines ELk, and any one data line DL among a plurality of data lines DL. By way of example, the pixel PX may be connected to a write scan line GWL, an initialization scan line GIL, a control scan line GCL, an emission line ELk, and a data line DL, as illustrated in FIG. 5A. In an embodiment, the pixel PX includes a scan line extending along a first direction, a data line DL extending along a second direction crossing the first direction and the pixel PX connected to the scan line and the data line DL.

The pixel PX includes a driving transistor DT, a light emitting element LEL, switch elements, and a capacitor C1 as shown in FIG. 5A. The switch elements include first to sixth transistors ST1, ST2, ST3, ST4, ST5, and ST6.

The driving transistor DT includes a gate electrode, a first electrode, and a second electrode. The driving transistor DT controls a drain-source current (hereinafter, referred to as "driving current") flowing between the first electrode and the second electrode according to a data voltage applied to the gate electrode.

The light emitting element LEL emits light by the driving current. A light emission amount of the light emitting element LEL may be proportional to the driving current.

The light emitting element LEL may be an organic light emitting diode including an anode electrode, a cathode electrode, and an organic light emitting layer disposed between the anode electrode and the cathode electrode. Alternatively, the light emitting element LEL may be an inorganic light emitting element including an anode electrode, a cathode electrode, and an inorganic semiconductor disposed between the anode electrode and the cathode electrode. Alternatively, the light emitting element LEL may be a quantum dot light emitting element including an anode electrode, a cathode electrode, and a quantum dot light emitting layer disposed between the anode electrode and the cathode electrode. Alternatively, the light emitting element LEL may be a micro light emitting diode.

The anode electrode of the light emitting element LEL may be connected to a first electrode of the fourth transistor ST4 and a second electrode of the sixth transistor ST6, and the cathode electrode thereof may be connected to a first power line VSL. A parasitic capacitance Cel may be formed between the anode electrode and the cathode electrode of the light emitting element LEL.

The capacitor C1 is formed between the second electrode of the driving transistor DT and a second power line VDL. One electrode of the capacitor Cl may be connected to the second electrode of the driving transistor DT, and the other electrode thereof may be connected to the second power line VDL.

The driving transistor DT, the second transistor ST2, the fourth transistor ST4, the fifth transistor ST5, and the sixth transistor ST6 may be configured as P-type metal oxide semiconductor field effect transistors (MOSFETs), and the first transistor ST1 and the third transistor ST3 may be configured as N-type MOSFETs. An active layer of each of the driving transistor DT, the second transistor ST2, the fourth transistor ST4, the fifth transistor ST5 and the sixth transistor ST6 configured as the P-type MOSFETs may be formed of polysilicon, whereas an active layer of each of the first transistor ST1 and the third transistor ST3 configured as the N-type MOSFETs may be formed of an oxide semiconductor. In this case, since the transistors formed of the polysilicon and the transistors formed of the oxide semiconductor may be disposed in different layers, the placement area of the respective transistors of each pixel PX can be reduced.

A gate electrode of the second transistor ST2 and a gate electrode of the fourth transistor ST4 may be connected to the write scan line GWL, and a gate electrode of the first transistor ST1 may be connected to the control scan line GCL. A gate electrode of the third transistor ST3 may be connected to the initialization scan line GIL. Since the first transistor ST1 and the third transistor ST3 are configured as the N-type MOSFETs, they may be turned on when a scan signal of a gate high voltage is applied to the control scan line GCL and the initialization scan line GIL. In contrast, since the second transistor ST2, the fourth transistor ST4, the fifth transistor ST5, and the sixth transistor ST6 are configured as the P-type MOSFETs, they may be turned on when an emission signal and a scan signal of a gate low voltage are applied to the emission line ELk and the write scan line GWL, respectively.

Figure 5B:
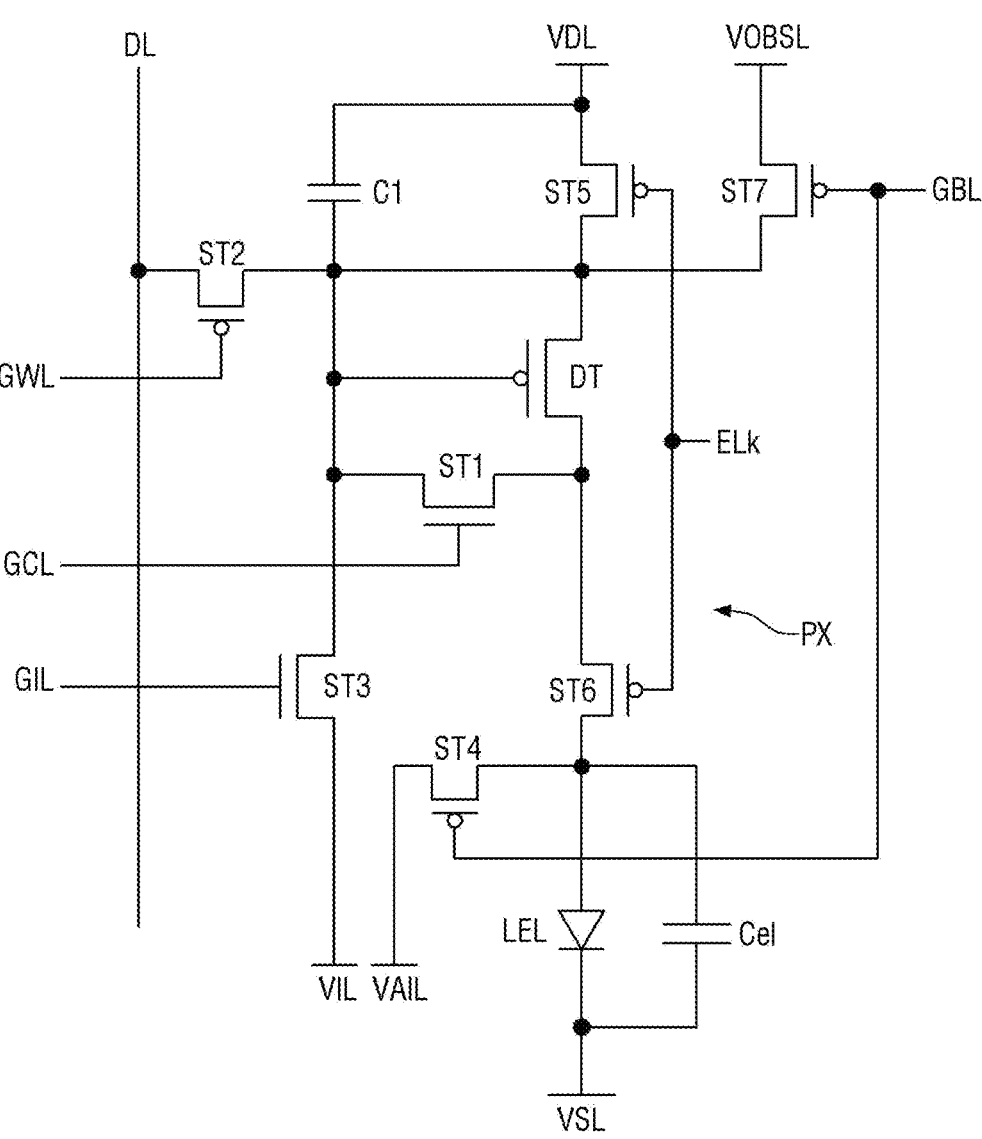
FIGS. 5B and 5C are circuit diagrams illustrating an embodiment of a pixel in a display area of a display panel.

Alternatively, the pixel PX may further include a seventh transistor ST7 as depicted in FIG. 5B. An active layer of the seventh transistor ST7 may be formed of polysilicon. The gate electrode of the fourth transistor ST4 and a gate electrode of the seventh transistor ST7 may be connected to a bias scan line GBL. Since the fourth transistor ST4 and the seventh transistor ST7 are configured as the P-type MOS-FETs, they may be turned on when a scan signal of a gate low voltage is applied to the bias scan line GBL. Also, the second electrode of the fourth transistor ST4 is connected to the second initialization voltage line VAIL to which the second initialization voltage is applied, and the first electrode of the seventh transistor ST7 is the driving voltage to which the driving voltage is applied. It may be connected to the wiring VOBSL. The driving voltage may have a plurality of voltage levels. That is, the driving voltage may be a variable driving voltage.

Figure 5C:
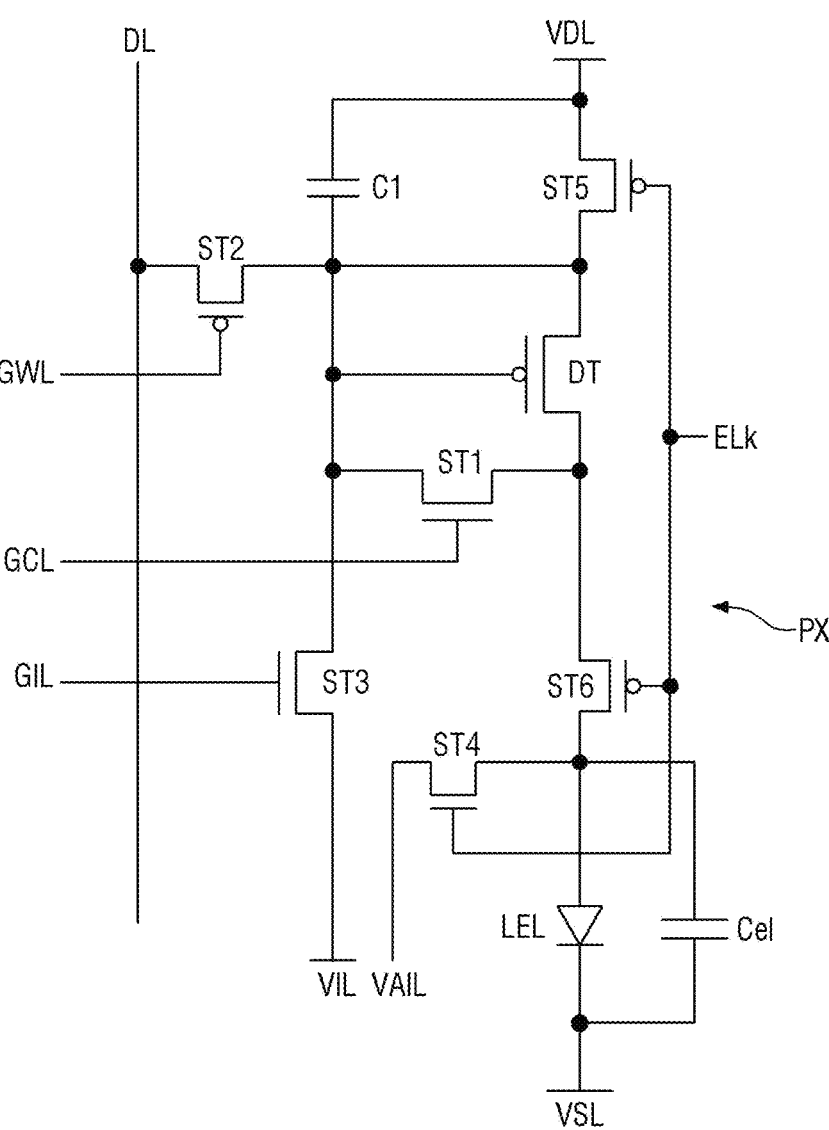

Alternatively, the active layer of the fourth transistor ST4 may be formed of an oxide semiconductor as shown in FIG. 5C. The gate electrode of the fourth transistor ST4, the gate electrode of the fifth transistor ST5, and the gate electrode of the sixth transistor ST6 may be connected to the emission line ELk. Since the sixth transistor ST6 is configured as the N-type MOSFET, it may be turned on when an emission signal of a gate high voltage is applied to the emission line ELk.

Alternatively, though not illustrated in FIGS. 5A to 5C, the first to sixth transistors ST1, ST2, ST3, ST4, ST5 and ST6 and the driving transistor DT may all be configured as P-type MOSFETs or N-type MOSFETs.

Figure 6:
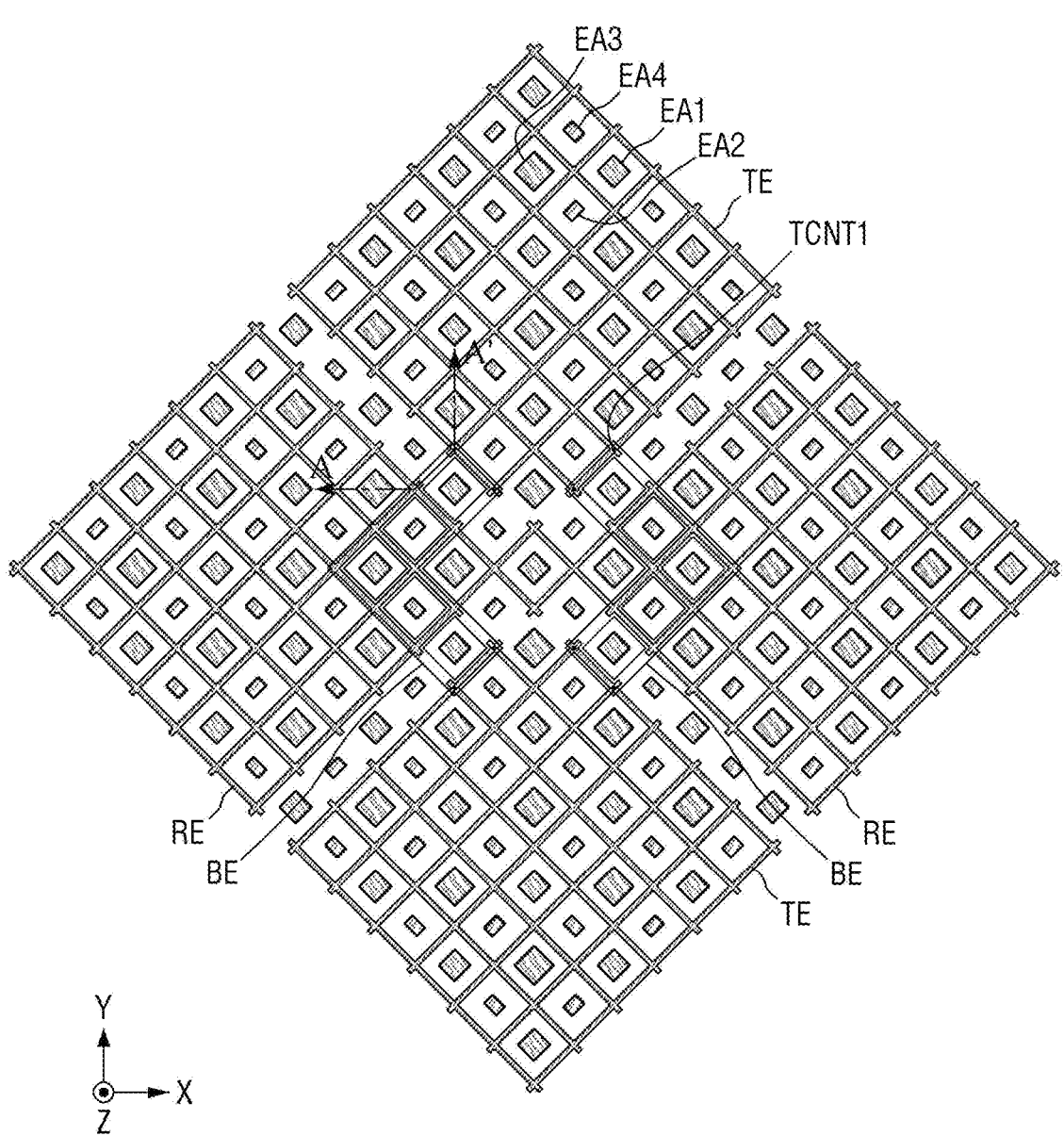
FIG. 6 is a plan view illustrating an embodiment of pixels and touch electrodes of a display area of a display panel.

FIG. 6 is a plan view illustrating an embodiment of emission portions and touch electrodes of a display area DA of a display panel 100.

FIG. 6 illustrates first to fourth emission portions EA1, EA2, EA3 and EA4 of the display area DA, driving electrodes TE, and sensing electrodes RE. In FIG. 6, it is assumed that a mutual capacitance type touch driving method is employed, using two types of touch electrodes, that is, the driving electrodes TE and the sensing electrodes RE to detect or sense a contact or touch (e.g., external input) to the display panel 100. For simplicity of description, FIG. 6 illustrates two sensing electrodes RE adjacent in the first direction (X-axis direction) and two driving electrodes TE adjacent in the second direction (Y-axis direction).

Referring to FIG. 6, the driving electrodes TE and the sensing electrodes RE may be electrically separated from each other. The driving electrodes TE and the sensing electrodes RE may be arranged in a same layer of the display panel 100 to be separated from each other in the same layer. The driving electrodes TE and the sensing electrodes RE may have a gap therebetween in a direction along a substrate.

The sensing electrodes RE may be electrically connected to each other in the first direction (X-axis direction). The driving electrodes TE may be electrically connected to each other in the second direction (Y-axis direction). For electrical separation between the sensing electrodes RE and the driving electrodes TE at the intersections thereof, the driving electrodes TE adjacent in the second direction (Y-axis direction) may be connected via a respective connection portion BE among a plurality of connection portions BE. The sensing electrodes RE may be connected to sensing lines, and the driving electrodes TE may be connected to driving lines. The sensing lines and the driving lines may be referred to as touch lines (see FIG. 13) generically. The driving electrodes TE, the sensing electrodes RE and the connection portions BE may be formed to have a mesh structure or a net structure in a plan view. The mesh structure may be defined by solid portions of the various elements which are spaced apart from each other to define an opening between adjacent solid portions.

The connection portions BE may be formed in a layer different from the layer in which the driving and sensing electrodes TE and RE are formed, and may be connected to the driving electrodes TE via a respective first sensor contact hole TCNT1 among a plurality of first sensor contact holes TCNT1. One end of each of the connection portions BE may be connected via the first sensor contact holes TCNT1 to any one of the driving electrodes TE adjacent to each other in the second direction (Y-axis direction). The other end of each of the connection portions BE may be connected via a respective first sensor contact hole TCNT1 among the plurality of the first sensor contact holes TCNT1 to another one of the driving electrodes TE adjacent to each other in the second direction (Y-axis direction). The connection portions BE may overlap the sensing electrodes RE in the third direction (Z-axis direction). Since the connection portions BE may be formed in a layer different from the layer where the driving and sensing electrodes TE and RE are formed, although overlapping the sensing electrodes RE in the third direction (Z-axis direction), the connection portions BE may be electrically separated from the sensing electrodes RE. As being in a same layer, elements may be respective patterns or portions of a same material layer. As being in different layers, elements may be patterns or portions of different material layers, respectively.

The display area DA may include the plurality of emission portions EA1, EA2, EA3 and EA4 for displaying images. Each of the emission portions EA1 to EA4 may be defined as a planar area from which the light emitting element LEL of FIG. 6 emits light.

In an embodiment, for example, the display area DA may include the first to fourth emission portions EA1 to EA4. In this case, the first emission portion EA1 may refer to an area (e.g., planar area) of the light emitting element LEL (see FIG. 5A) which emits first light, and the second emission portion EA2 may refer to an area of the light emitting element LEL (see FIG. 5A) which emits second light. Further, the third emission portion EA3 may refer to an area of the light emitting element LEL (see FIG. 5A) which emits third light, and the fourth emission portion EA4 may refer to an area of the light emitting element LEL (see FIG. 5A) which emits fourth light.

The first emission portion EA1, the second emission portion EA2, the third emission portion EA3, and the fourth emission portion EA4 may emit different color lights. It may also be possible for two of the first emission portion EA1, the second emission portion EA2, the third emission portion EA3, and the fourth emission portion EA4 to emit the same color light. In an embodiment, for example, the first emission portion EA1 may emit red light, the second and fourth emission portions EA2 and EA4 may emit green light, and the third emission portion EA3 may emit blue light.

Although it is exemplarily shown that the first emission portion EA1, the second emission portion EA2, the third emission portion EA3, and the fourth emission portion EA4 may each have a shape of a quadrangle such as a rhombus in a plan view, the present disclosure is not limited thereto. In an embodiment, for example, the first emission portion EA1, the second emission portion EA2, the third emission portion EA3, and the fourth emission portion EA4 may each have a shape of a polygon other than a quadrangle, a circle, or an ellipse in a plan view.

Further, although it is exemplarily illustrated that, among the first to fourth emission portions EA1 to EA4, the third emission portion EA3 has the largest size, the first emission portion EA1 has the second largest size, and the second and fourth emission portions EA2 and EA4 have the smallest size, the present disclosure is not limited thereto.

Since the driving electrodes TE, the sensing electrodes RE and the connection portions BE are formed to have a mesh structure or a net structure in a plan view, the emission portions EA1 to EA4 may not overlap the driving electrodes TE, the sensing electrodes RE and the connection portions BE in the third direction (Z-axis direction). Thus, reduction of luminance of the lights, which might be caused when the lights emitted from the emission portions EA1 to EA4 are blocked by the driving electrodes TE, the sensing electrodes RE and the connection portions BE, can be prevented or reduced.

Figure 7:
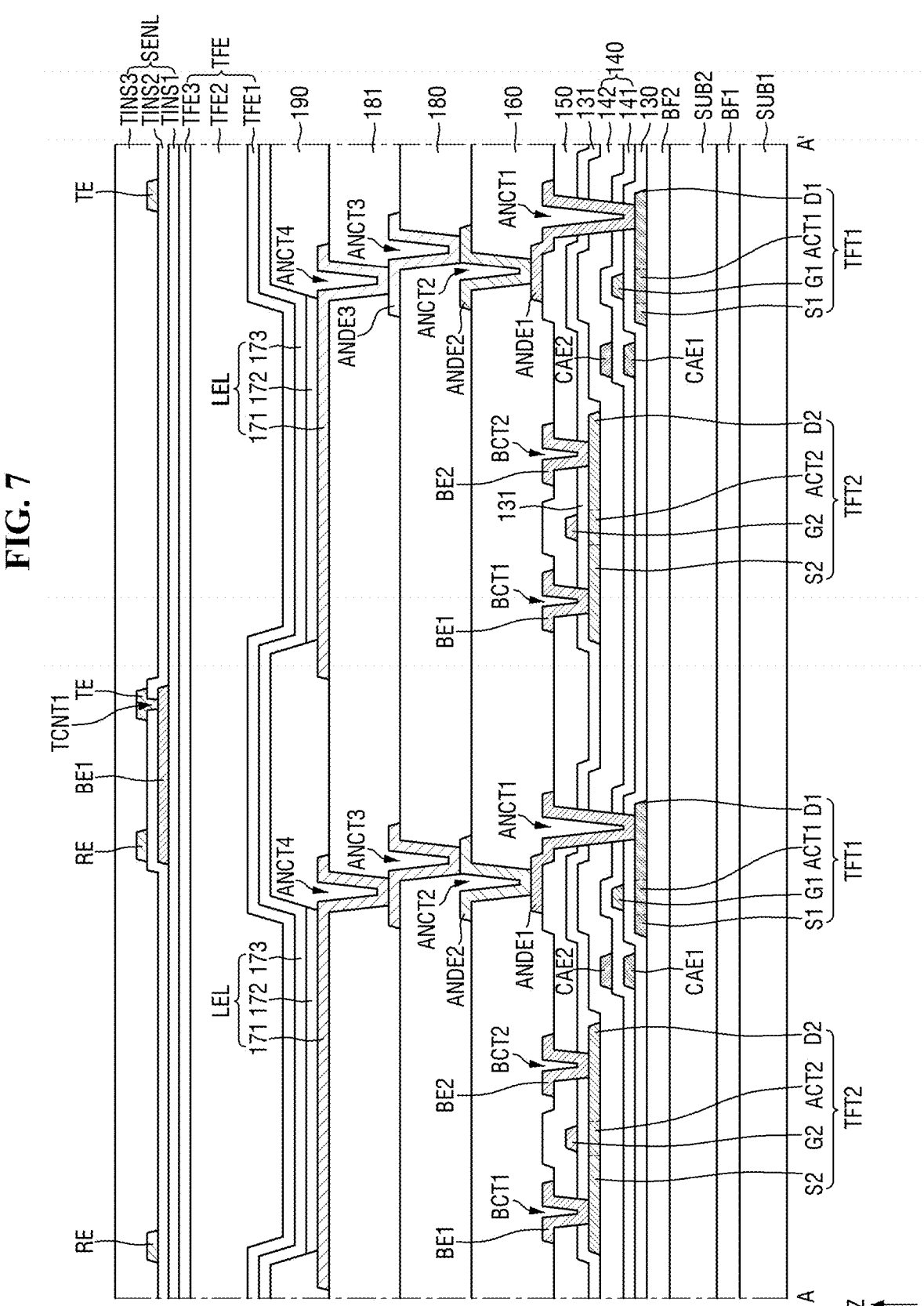
FIG. 7 is a cross-sectional view illustrating an embodiment of the display panel taken along line A-A' of FIG. 6.

FIG. 7 is a cross-sectional view illustrating an embodiment of the display panel 100 taken along line A-A' of FIG. 6.

Referring to FIG. 7, each pixel PX may include a first thin film transistor TFT1, a second thin film transistor TFT2, and a light emitting element LEL. The first thin film transistor TFT1 may be the sixth transistor ST6 of FIG. 5A, and the second thin film transistor TFT2 may be the first transistor ST1 or the third transistor ST3 of FIG. 5A. That is, FIG. 7 illustrates only some of the driving transistors DT and the first to sixth transistors ST1 to ST6 of FIG. 5A, for the simplicity of illustration.

A first barrier layer BF1 may be disposed on a first substrate SUB1, a second substrate SUB2 may be disposed on the first barrier layer BF1, and a second barrier layer BF2 may be disposed on the second substrate SUB2.

Each of the first substrate SUB1 and the second substrate SUB2 may be made of or include an insulating material such as polymer resin or the like. In an embodiment, for example, the first substrate SUB1 and the second substrate SUB2 may be made of polyimide. Each of the first substrate SUB1 and the second substrate SUB2 may be a flexible substrate which can be bent, folded and rolled.

Each of the first barrier layer BF1 and the second barrier layer BF2 is a layer for protecting a thin film transistor of a thin film transistor layer and a light emitting layer 172 as a respective pattern of a light emitting element layer from moisture permeating through the first substrate SUB1 and the second substrate SUB2 which are susceptible to moisture permeation.

Each of the first barrier layer BF1 and the second barrier layer BF2 may be formed of a plurality of inorganic layers that are alternately stacked. In an embodiment, for example, each of the first barrier layer BF1 and the second barrier layer BF2 may be formed of multiple layers in which one or more inorganic layers of a silicon nitride layer, a silicon oxynitride layer, a silicon oxide layer, a titanium oxide layer and an aluminum oxide layer are alternately stacked.

The first thin film transistor TFT1 and the second thin film transistor TFT2 may be disposed on the second barrier layer BF2. The first thin film transistor TFT1 may include a first active layer ACT1, a first gate electrode G1, a first source electrode S1, and a first drain electrode D1. The second thin film transistor TFT2 may include a second active layer ACT2, a second gate electrode G2, a second source electrode S2, and a second drain electrode D2.

The first active layer ACT1, the first source electrode S1 and the first drain electrode D1 of the first thin film transistor TFT1 may be disposed on a buffer layer (not shown). The first active layer ACT1 may include a silicon semiconductor such as polycrystalline silicon, monocrystalline silicon, low-temperature polycrystalline silicon, and amorphous silicon. The first source electrode S1 and the first drain electrode D1 may be formed by doping a silicon semiconductor with ions or impurities to have conductivity. The first active layer ACT1 may overlap the first gate electrode G1 in the third direction (Z-axis direction) which is the thickness direction of the first substrate SUB1 and the second substrate SUB2, and the first source electrode S1 and the first drain electrode D1 may not overlap the first gate electrode G1 in the third direction (Z-axis direction).

A first gate insulating layer 130 may be disposed on the first active layer ACT1, the first source electrode S1 and the first drain electrode D1 of the first thin film transistor TFT1. The first gate insulating layer 130 may be formed of an inorganic layer, for example, a silicon nitride layer, a silicon oxynitride layer, a silicon oxide layer, a titanium oxide layer, or an aluminum oxide layer.

The first gate electrode G1 of the first thin film transistor TFT1 and a first capacitor electrode CAE1 may be disposed on the first gate insulating layer 130. The first gate electrode G1 may overlap the first active layer ACT1 in the third direction (Z-axis direction). The first capacitor electrode CAE1 may overlap a second capacitor electrode CAE2 in the third direction (Z-axis direction) to face the second capacitor electrode CAE2. The first gate electrode G1 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A first interlayer insulating layer 141 may be disposed on the first gate electrode G1 and the first capacitor electrode CAE1. The first interlayer insulating layer 141 may be formed of an inorganic layer, for example, a silicon nitride layer, a silicon oxynitride layer, a silicon oxide layer, a titanium oxide layer, or an aluminum oxide layer.

The second capacitor electrode CAE2 may be disposed on the first interlayer insulating layer 141. Since the first interlayer insulating layer 141 has a predetermined permittivity, a capacitor may be formed by the first and second capacitor electrodes CAE1 and CAE2 and the first interlayer insulating layer 141 which is disposed between the first and second capacitor electrodes CAE1 and CAE2. The second capacitor electrode CAE2 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A second interlayer insulating layer 142 may be disposed on the second capacitor electrode CAE2. The second interlayer insulating layer 142 may be formed of an inorganic layer, for example, a silicon nitride layer, a silicon oxynitride layer, a silicon oxide layer, a titanium oxide layer, or an aluminum oxide layer. The second interlayer insulating layer 142 may include a plurality of inorganic layers, and may be larger in thickness than the first interlayer insulating layer 141 in the third direction (Z-axis direction).

The second active layer ACT2, the second source electrode S2 and the second drain electrode D2 of the second thin film transistor TFT2 may be disposed on the second interlayer insulating layer 142. The second active layer ACT2 may include an oxide semiconductor. The second source electrode S2 and the second drain electrode D2 may be formed by doping an oxide semiconductor with ions or impurities to have conductivity. The second active layer ACT2 may overlap the second gate electrode G2 in the third direction (Z-axis direction), whereas the second source electrode S2 and the second drain electrode D2 may not overlap the second electrode G2 in the third direction (Z-axis direction).

A second gate insulating layer 131 may be disposed on the second active layer ACT2, the second source electrode S2, and the second drain electrode D2 of the second thin film transistor TFT2. The second gate insulating layer 131 may be disposed under the second gate electrode G2. The second gate insulating layer 131 may be formed of an inorganic layer, for example, a silicon nitride layer, a silicon oxynitride layer, a silicon oxide layer, a titanium oxide layer, or an aluminum oxide layer.

The second gate electrode G2 of the second thin film transistor TFT2 may be disposed on the second gate insulating layer 131. The second gate electrode G2 may overlap the second active layer ACT2 in the third direction (Z-axis direction). The second gate electrode G2 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A third interlayer insulating layer 150 may be disposed on the second gate electrode G2. The third interlayer insulating layer 150 may be formed of an inorganic layer, for example, a silicon nitride layer, a silicon oxynitride layer, a silicon oxide layer, a titanium oxide layer, or an aluminum oxide layer. The third interlayer insulating layer 150 may be made of a plurality of inorganic films.

A first anode connection electrode ANDE1, a first connection electrode BE1 and a second connection electrode BE2 may be disposed on the third interlayer insulating layer 150. The first anode connection electrode ANDE1 may be connected to the first drain electrode D1 through a first anode contact hole ANCT1 which is formed through the interlayer insulating layer 140 and the third interlayer insulating layer 150 to expose the first drain electrode D1 of the first thin film transistor TFT1 to outside the interlayer insulating layer 140 and the third interlayer insulating layer 150. The interlayer insulating layer 140 may include the first interlayer insulating layer 141 and the second interlayer insulating layer 142. The first connection electrode BE1 may be connected to the second source electrode S2 of the second thin film transistor TFT2 through a first connection contact hole BCT1 which is formed through the third interlayer insulating layer 150 to expose the second source electrode S2 to outside the third interlayer insulating layer 150. The second connection electrode BE2 may be connected to the second drain electrode D2 of the second thin film transistor TFT2 through a second connection contact hole BCT2 which is formed through the third interlayer insulating layer 150 to expose the second drain electrode D2 to outside the third interlayer insulating layer 150. The first anode connection electrode ANDE1, the first connection electrode BE1 and the second connection electrode BE2 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A first organic layer 160 for planarization may be disposed on the first anode connection electrode ANDE1, the first connection electrode BE1 and the second connection electrode BE2. The first organic layer 160 may be formed of an organic layer such as acryl resin, epoxy resin, phenolic resin, polyamide resin, polyimide resin and the like.

The second anode connection electrode ANDE2 may be disposed on the first organic layer 160. The second anode connection electrode ANDE2 may be connected to the first anode connection electrode ANDE1 through a second anode contact hole ANCT2 which is formed through the first organic layer 160 to expose the first anode connection electrode ANDE1 to outside the first organic layer 160. The second anode connection electrode ANDE2 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A second organic layer 180 may be disposed on the second anode connection electrode ANDE2. The second organic layer 180 may be formed of an organic layer such as acryl resin, epoxy resin, phenolic resin, polyamide resin, polyimide resin and the like.

A third anode connection electrode ANDE3 may be disposed on the second organic layer 180. The third anode connection electrode ANDE3 may be connected to the second anode connection electrode ANDE2 through a third anode contact hole ANCT3 which is formed through the second organic layer 180 to expose the second anode connection electrode ANDE2 outside of the second organic layer 180. The third anode connection electrode ANDE3 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A third organic layer 181 may be disposed on the third anode connection electrode ANDE3. The third organic layer 181 may be formed of an organic layer such as acryl resin, epoxy resin, phenolic resin, polyamide resin, polyimide resin and the like.

Although FIG. 7 exemplarily illustrates the first thin film transistor TFT1 and the second thin film transistor TFT2 are configured to be of a top gate type in which a gate electrode is located on top of an active layer, the present disclosure is not limited thereto. The first thin film transistor TFT1 and the second thin film transistor TFT2 may be configured to be of a bottom gate type in which a gate electrode is located under an active layer, or a double gate type in which gate electrodes are located on and under an active layer.

Light emitting elements LEL and a bank 190 may be disposed on the third organic layer 181. Each of the light emitting elements LEL includes a first light emitting electrode 171, a light emitting layer 172, and a second light emitting electrode 173. The first light emitting electrode 171 may be an anode electrode, and the second light emitting electrode 173 may be a cathode electrode.

The first light emitting electrode 171 may be formed on the third organic layer 181. The first light emitting electrode 171 may be connected to the third anode connection electrode ANDE3 through a fourth anode contact hole ANCT4 which is formed through the third organic layer 181 to expose the third anode connection electrode ANDE3 outside of the third organic layer 181.

In a top emission structure in which light is emitted toward the second light emitting electrode 173 when viewed with respect to the light emitting layer 172, the first light emitting electrode 171 may be formed of a metal material having high reflectivity to have a stacked structure (Ti/Al/Ti) of aluminum and titanium, a stacked structure (ITO/Al/ITO) of aluminum and ITO, a stacked structure (ITO/Ag/ITO) of silver and ITO, an APC alloy, and a stacked structure (ITO/APC/ITO) of an APC alloy and ITO. The APC alloy is an alloy of silver (Ag), palladium (Pd) and copper (Cu).

The bank 190 may be formed to partition the first light emitting electrode 171 on the second organic layer 180 to define the emission portions EA1, EA2, EA3 and EA4. The bank 190 may be formed to cover the edge of the first light emitting electrode 171. The bank 190 may be formed of an organic layer such as acryl resin, epoxy resin, phenolic resin, polyamide resin, polyimide resin and the like.

Each of the emission portions EA1, EA2, EA3, and EA4 represents an area in which the first light emitting electrode 171, the light emitting layer 172, and the second light emitting electrode 173 are sequentially stacked to define an overlapping area, and holes from the first light emitting electrode 171 and electrons from the second light emitting electrode 173 are combined with each other in the light emitting layer 172 to emit light.

The light emitting layer 172 is formed on the first light emitting electrode 171 and the bank 190. The light emitting layer 172 may include an organic material to emit light in a predetermined color. In an embodiment, for example, the light emitting layer 172 includes a hole transporting layer, an organic material layer, and an electron transporting layer.

The second light emitting electrode 173 is formed on the light emitting layer 172. The second light emitting electrode 173 may be formed to cover the light emitting layer 172. The second light emitting electrode 173 may be a common layer shared by all of the emission portions EA1, EA2, EA3 and EA4. A capping layer (not shown) may be formed on the second light emitting electrode 173.

In the top emission structure, the second light emitting electrode 173 may be formed of transparent conductive oxide (TCO) such as indium tin oxide (ITO) and indium zinc oxide (IZO) capable of transmitting light or a semi-transmissive conductive material such as magnesium (Mg), silver (Ag), or an alloy of magnesium (Mg) and silver (Ag). When the second light emitting electrode 173 is formed of a semi-transmissive conductive material, the light emission efficiency can be increased due to a micro-cavity effect.

An encapsulation layer TFE may be disposed on the second light emitting electrode 173. The encapsulation layer TFE includes at least one inorganic layer to prevent oxygen or moisture from permeating into the light emitting element layer. In addition, the encapsulation layer TFE includes at least one organic layer to protect the light emitting element layer from foreign substances such as dust. In an embodiment, for example, the encapsulation layer TFE includes a first encapsulation inorganic layer TFE1, an encapsulation organic layer TFE2, and a second encapsulation inorganic layer TFE3.

The first encapsulation inorganic layer TFE1 may be disposed on the second light emitting electrode 173, the encapsulation organic layer TFE2 may be disposed on the first encapsulation inorganic layer TFE1, and the second encapsulation inorganic layer TFE3 may be disposed on the encapsulation organic layer TFE2. That is, the first encapsulation inorganic layer TFE1, the encapsulation organic layer TFE2 and the second encapsulation inorganic layer TFE3 are in order in a direction from the light emitting element LEL. The first inorganic encapsulation layer TFE1 and the second encapsulation inorganic layer TFE3 may be formed of multiple layers in which one or more inorganic layers of a silicon nitride layer, a silicon oxynitride layer, a silicon oxide layer, a titanium oxide layer and an aluminum oxide layer are alternately stacked. The encapsulation organic layer TFE2 may be formed of acryl resin, epoxy resin, phenolic resin, polyamide resin, polyimide resin or the like.

The sensor electrode layer SENL may be disposed on the encapsulation layer TFE. The sensor electrode layer SENL may include the driving electrodes TE, the sensing electrodes RE, and the connection portion BE.

The sensor electrode layer SENL may include a first sensor insulating layer TINS1 disposed on the second encapsulation inorganic layer TFE3. The first sensor insulating layer TINS1 may be formed of multiple layers in which one or more inorganic layers of a silicon nitride layer, a silicon oxynitride layer, a silicon oxide layer, a titanium oxide layer and an aluminum oxide layer are alternately stacked. Alternatively, the first sensor insulating layer TINS1 may be formed of an organic layer such as acryl resin, epoxy resin, phenolic resin, polyamide resin, polyimide resin and the like.

The connection portion BE may be disposed on the first sensor insulating layer TINS1. The connection portion BE may not overlap the first emission portion EA1, the second emission portion EA2, the third emission portion EA3 and the fourth emission portion EA4 in the third direction (Z-axis direction). The connection portion BE may overlap the bank 190 in the third direction (Z-axis direction). The connection portion BE may be formed of a single layer containing molybdenum (Mo), titanium (Ti), copper (Cu), or aluminum (Al), or may be formed to have a stacked structure (Ti/Al/Ti) of aluminum and titanium, a stacked structure (ITO/Al/ITO) of aluminum and indium tin oxide (ITO), an Ag—Pd—Cu (APC) alloy, or a stacked structure (ITO/APC/ITO) of APC alloy and ITO.

The sensor electrode layer SENL may include a second sensor insulating layer TINS2 disposed on the connection portion BE. The second sensor insulating layer TINS2 may be formed of multiple layers in which one or more inorganic layers of a silicon nitride layer, a silicon oxynitride layer, a silicon oxide layer, a titanium oxide layer and an aluminum oxide layer are alternately stacked. Alternatively, the second sensor insulating layer TINS2 may be formed of an organic layer such as acryl resin, epoxy resin, phenolic resin, polyamide resin, polyimide resin and the like.

The driving electrodes TE and the sensing electrodes RE may be disposed on the second sensor insulating layer TINS2. The driving electrodes TE and the sensing electrodes RE may not overlap the first emission portion EA1, the second emission portion EA2, the third emission portion EA3, and the fourth emission portion EA4 in the third direction (Z-axis direction). The driving electrodes TE and the sensing electrodes RE may overlap the bank 190 in the third direction (Z-axis direction). The driving electrodes TE may be connected to the connection portion BE via the first sensor contact hole TCNT1 penetrating the second sensor insulating layer TINS2. The driving electrodes TE and the sensing electrodes RE may be formed of a single layer containing molybdenum (Mo), titanium (Ti), copper (Cu), or aluminum (Al), or may be formed to have a stacked structure (Ti/Al/Ti) of aluminum and titanium, a stacked structure (ITO/Al/ITO) of aluminum and indium tin oxide (ITO), an Ag—Pd—Cu (APC) alloy, or a stacked structure (ITO/APC/ITO) of APC alloy and ITO.

In FIG. 7, though the connection portion BE is illustrated to be disposed on the first sensor insulating layer TINS1, and the driving electrodes TE and the sensing electrodes RE are illustrated to be disposed on the second sensor insulating layer TINS2, the present disclosure is not limited thereto. By way of example, the driving electrodes TE and the sensing electrodes RE may be disposed on the first sensor insulating layer TINS1, and the connection portion BE may be disposed on the second sensor insulating layer TINS2.

The sensor electrode layer SENL may include a third sensor insulating layer TINS3 disposed on the driving electrodes TE and the sensing electrodes RE. The third sensor insulating layer TINS3 may be formed of an organic layer such as acryl resin, epoxy resin, phenolic resin, polyamide resin, polyimide resin and the like.

Figure 8:
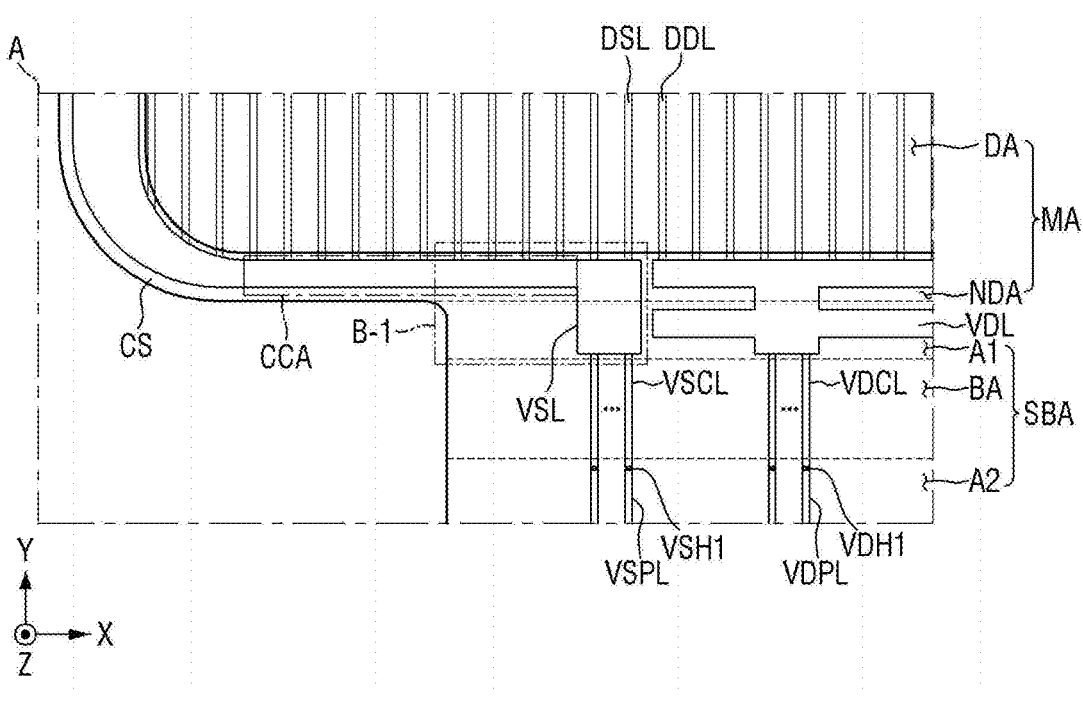
FIG. 8 is a plan view illustrating an embodiment of a non-display area of a display panel.
Figure 9:
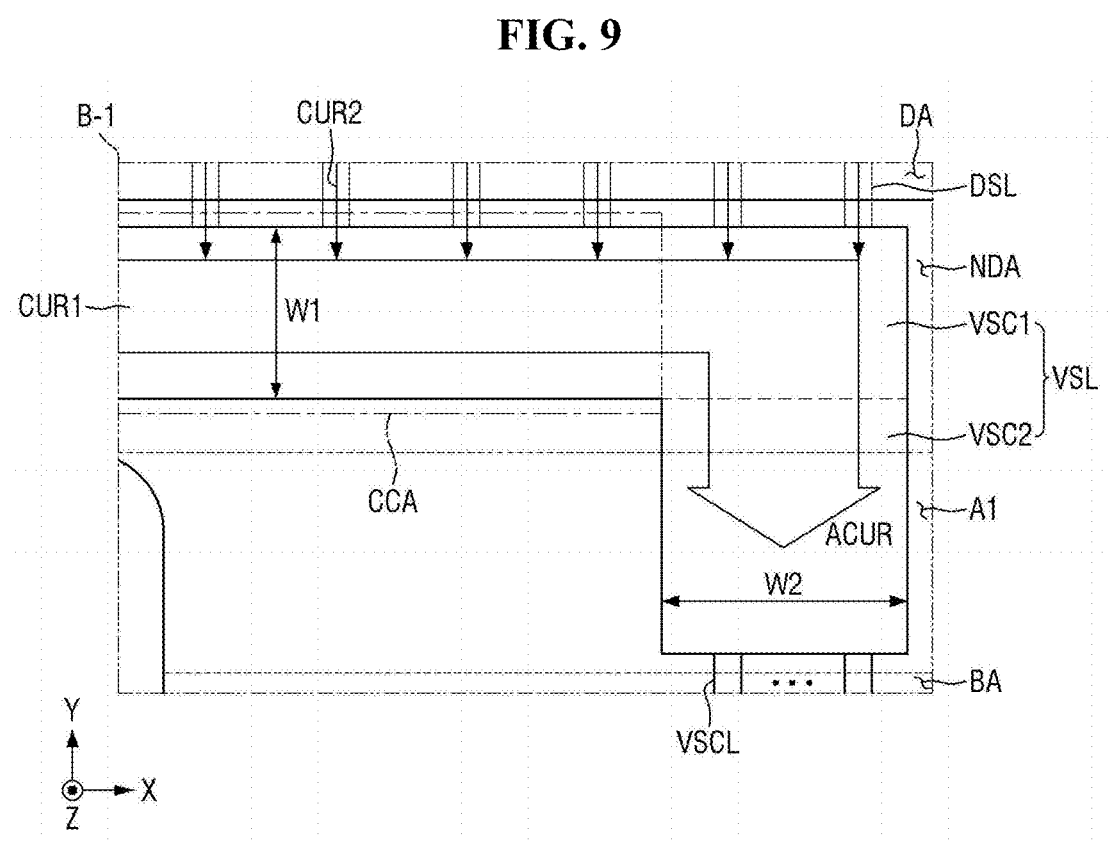

FIG. 8 is an enlarged plan view illustrating an embodiment of a non-display area NDA of a display panel 100. FIG. 8 is an enlarged plan view of area A in FIG. 2. FIG. 9 is an enlarged plan view showing in detail an embodiment of a first power line VSL of area B-1 of FIG. 8.

FIG. 8 and FIG. 9 illustrate, for the sake of simple description, the first power line VSL, the second power line VDL, first power connection lines VSCL, first power pad lines VSPL, first power connection holes VSH1, second power connection lines VDCL, second power pad lines VDPL, second power connection holes VDH1, first display power lines DSL, and second display power lines DDL.

Referring to FIG. 8 and FIG. 9, the first display power lines DSL and the second display power lines DDL may be disposed in the display area DA. The first display power lines DSL and the second display power lines DDL may extend in the second direction (Y-axis direction). The first display power lines DSL may be connected to the first power line VSL, and the second display power lines DDL may be connected to the second power line VDL. The first display power lines DSL and the second display power lines DDL enable more uniform application of a first power voltage and a second power voltage to the pixels PX of the display area DA.

The first display power lines DSL and the second display power lines DDL may be arranged in a mesh shape (or net shape) in the display area DA. In this case, the first display power lines DSL and the second display power lines DDL may be disposed in different layers, and may intersect with each other in the plan view.

The first power line VSL may be connected to the first display power lines DSL in the non-display area NDA, and connected to the first power connection lines VSCL in the first area A1. The first power line VSL may be disposed in the non-display area NDA at the lower side and the left side of the display panel 100 and the corner where the lower side and the left side meet. Further, the first power line VSL may be disposed in the non-display area NDA at the lower side and the right side of the display panel 100 and the corner where the lower side and the right side meet. Further, the first power line VSL may be disposed in the non-display area NDA at the upper side of the display panel 100, the corner where the upper side and the left side meet, and the corner where the upper side and the right side meet. That is, the first power line VSL may be an outermost power line among the first power line VSL and the second power line VDL within the non-display area NDA, along the first direction and/or the second direction.

The second power line VDL may be connected to the second display power lines DDL in the non-display area NDA, and connected to the second power connection lines VDCL in the first area A1. The second power line VDL may be disposed in the non-display area NDA at the lower side of the display panel 100.

The first power connection lines VSCL may be disposed in the bending area BA, and the first power pad lines VSPL may be disposed in the second area A2. Each of the first power connection lines VSCL may be connected to the first power pad line VSPL through the first power connection hole VSH1. Each of the first power connection lines VSCL may be connected to the first power line VSL through a third power connection hole VSH2 (see FIG. 13). Each of the first power pad lines VSPL may be electrically connected to the display driving circuit 200. Thus, the first power voltage of the display driving circuit 200 can be supplied to the first power line VSL through the first power pad lines VSPL and the first power connection lines VSCL. That is, the first power line VSL receives the first power voltage and transmits a first power voltage to the pixel PX.

The second power connection lines VDCL may be disposed in the bending area BA, and the second power pad lines VDPL may be disposed in the second area A2. Each of the second power connection lines VDCL may be connected to the second power pad line VDPL through the second power connection hole VDH1. Each of the second power connection lines VDCL may be connected to the first power line VSL through a fourth power connection hole VDH2 (see FIG. 13). Each of the second power pad lines VDPL may be electrically connected to the display driving circuit 200. Thus, the second power voltage of the display driving circuit 200 can be supplied to the second power line VDL through the second power pad lines VDPL and the second power connection lines VDCL.

The first power line VSL may include, as illustrated in FIG. 9, a first power connection portion VSC1 and a second power connection portion VSC2. The first power connection portion VSC1 may extend in the first direction (X-axis direction) in the non-display area NDA at the lower side of the display panel 100. The first power connection portion VSC1 may be connected to the first display power lines DSL. The second power connection portion VSC2 may extend from the first power connection portion VSC1 in the second direction (Y-axis direction) in the first area A1 and the non-display area NDA at the lower side of the display panel 100. The second power connection portion VSC2 may be connected to the first power connection lines VSCL.

The first power connection portion VSC1 and the second power connection portion VSC2 may be directly connected to each other to provide the first power line VSL as a unitary element. The upper side of the second power connection portion VSC2 may be connected to the lower side of the first power connection portion VSC1. In this case, the right side of the second power connection portion VSC2 and the right side of the first power connection portion VSC1 may be arranged side by side. The side of the second power connection portion VSC2 and the side of the first power connection portion VSC1 may be aligned with each other.

An electrical current may flow through the first power line VSL in a current direction. The current direction may correspond to a direction in which a major dimension of the first power line VSL is extended. A major dimension of the first power connection portion VSC1 may extend along the first direction and a major dimension of the second power connection portion VSC2 may extend along the second direction. Respective widths of the first power line VSL may cross the current direction, such as being taken in a direction perpendicular to the current direction. Referring to FIG. 9, a first width W1 of the first power connection portion VSC1 may be smaller than a second width W2 of the second power connection portion VSC2.

Due to the reduction of the planar area of the non-display area NDA for the sake of enlarging the display area DA, the planar area of the first power line VSL is also reduced, which in turn results in reduction of the first width W1 of the first power connection portion VSC1 of the first power line VSL in the non-display area NDA. Within the first power line VSL, a region between the second power connection portion VSC2 and a corner area CS where the left side and the lower side of the main region MA meet may be a current concentration area CCA having a very small width in the second direction. The current concentration area CCA of the first power line VSL may occupy the most of the first power connection portion VSC1. In the current concentration area CCA of the first power line VSL, an added current ACUR, which is the sum of a first electric current CUR1 of the first power connection portion VSC1 and a second electric current CUR2 of the first display power line DSL, may flow.

As stated above, since the electric current is concentrated to the current concentration area CCA of the first power line VSL, heat may be generated in the current concentration area CCA of the first power line VSL. Due to the heat generated in the current concentration area CCA of the first power line VSL, the pixels PX in the display area DA adjacent to the current concentration area CCA of the first power line VSL may be degraded. In view of this, reducing the heat generation in the current concentration area CCA of the first power line VSL by distributing the electric current of the first power line VSL, will be explained in detail in the following description with reference to FIGS. 10 to 12, FIGS. 18 and 19, and FIGS. 21 and 22.

Figure 10:
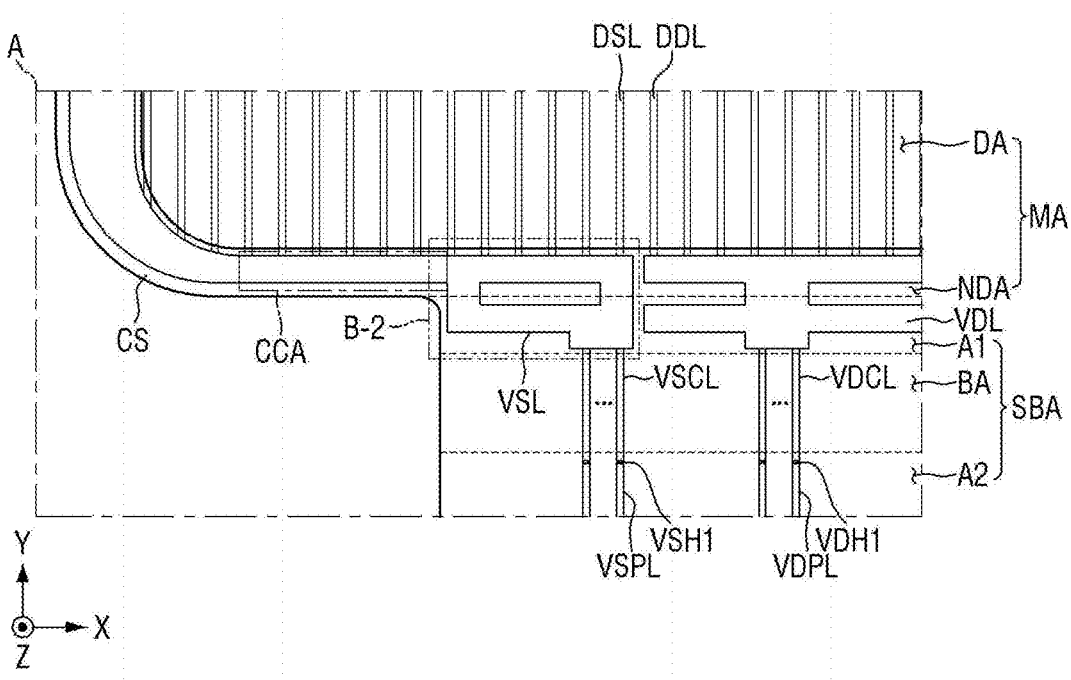
FIG. 10 is a plan view illustrating an embodiment of a non-display area of a display panel.
Figure 11:
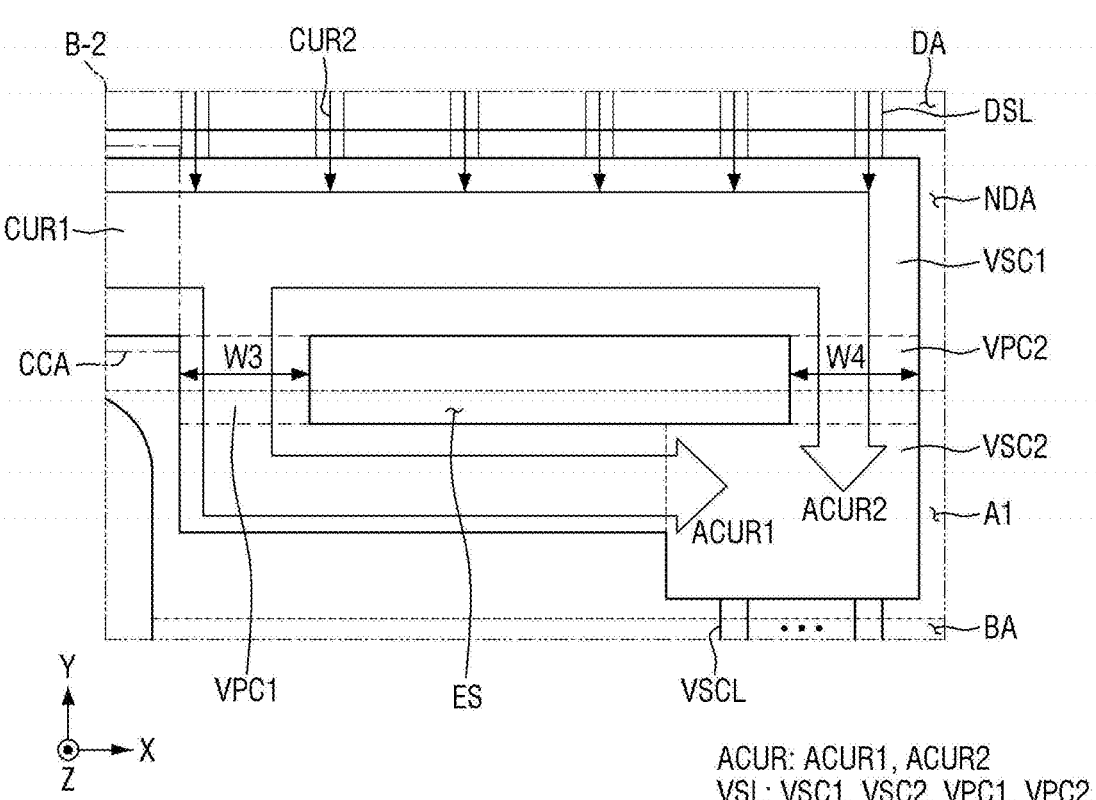
FIG. 11 is a plan view showing an embodiment of a first power line of area B-2 of FIG. 10.

FIG. 10 is an enlarged plan view illustrating an embodiment of a non-display area NDA of a display panel 100 corresponding to area A of FIG. 2. FIG. 11 is an enlarged plan view showing in detail an embodiment of a first power line VSL of area B-2 of FIG. 10.

The embodiment shown in FIGS. 10 and 11 is different from the embodiment shown in FIGS. 8 and 9 in that a first power line VSL thereof includes a plurality of power path portions VPC1 and VPC2. In the description made with reference to FIGS. 10 and 11, redundant parts of the description with reference to FIGS. 8 and 9 will be omitted.

Referring to FIGS. 10 and 11, the first power line VSL may include a first power connection portion VSC1, a second power connection portion VSC2, the first power path portion VPC1, and the second power path portion VPC2.

The first power connection portion VSC1 may extend in the first direction (X-axis direction) in a non-display area NDA at the lower side of a display panel 100. The first power connection portion VSC1 may be connected to first display power lines DSL.

The second power connection portion VSC2 may extend in the first direction (X-axis direction) in the first area A1 and the non-display area NDA at the lower side of the display panel 100. The second power connection portion VSC2 may be connected to first power connection lines VSCL.

The first power path portion VPC1 and the second power path portion VPC2 may be disposed between the first power connection portion VSC1 and the second power connection portion VSC2. The first power path portion VPC1 and the second power path portion VPC2 may connect the first power connection portion VSC1 and the second power connection portion VSC2 to each other. The first power path portion VPC1 and the second power path portion VPC2 may each extend in the second direction (Y-axis direction). The first power path portion VPC1 may be disposed closer to the outer edge of a sub-region SBA or closer to the corner area CS than the second power path portion VPC2.

As the plurality of power path portions VPC1 and VPC2 are disposed between the first power connection portion VSC1 and the second power connection portion VSC2, and as the first power path portion VPC1 is disposed adjacent to the outer edge of the sub-region SBA, an electric current concentrated in a current concentration area CCA of the first power line VSL can be flowed to the second power connection portion VSC2 through the first power path portion VPC1. Thus, the planar area of the current concentration area CCA of the first power line VSL can be reduced. That is, a region in the first power line VSL between the first power path portion VPC1 and a corner area CS where the left side and the lower side of a main region MA meet may be the current concentration area CCA having a very small width. Further, due to the reduction of the planar area of the current concentration area CCA of the first power line VSL, a heat generation amount in the current concentration area CCA of the first power line VSL can be reduced. Therefore, degradation of pixels PX in a display area DA adjacent to the first power line VSL can be reduced.

Further, the planar area of the current concentration area CCA of the first power line VSL may be reduced if the first power path portion VPC1 is located adjacent to the edge of the sub-region SBA. For the purpose, additional wires may not be disposed between the first power path portion VPC1 and the edge of the sub-region SBA. That is, the wire located closest to the edge of the sub-region SBA may be the first power path portion VPC1 of the first power line VSL.

TABLE 1

| Ratio of width of first power path portion VPC1 to width of second power path portion VPC2 | Maximum temperature (degrees Celsius ° C.) of current concentration area CCA |
|---|---|
| Non-existence of first power path portion VPC1 (Embodiment of FIGS. 8 and 9) | 36.6° C. |
| 1:2.5 | 35.4° C. |
| 1:1 | 35.4° C. |
| 2:1 | 35.3° C. |
| 3:1 | 35.1° C. |

Referring to Table 1, as compared to the embodiment of FIGS. 8 and 9 where the first power path portion VPC1 is not provided, the temperature of the current concentration area CCA is found to be reduced by 1.2° C. or more when the first power path portion VPC1 exists. As can be seen from Table 1, a third width W3 of the first power path portion VPC1 may be equal to or larger than 40% of a fourth width W4 of the second power path portion VPC2. Here, with an increase of the third width W3 of the first power path portion VPC1, the temperature reduction effect of the current concentration area CCA of the first power line VSL can be enhanced. Thus, to maximize the temperature reduction effect of the current concentration area CCA of the first power line VSL, the third width W3 of the first power path portion VPC1 which is closer to the corner area CS may be set to be larger than the fourth width W4 of the second power path portion VPC2.

The sum of the third width W3 of the first power path portion VPC1 and the fourth width W4 of the second power path portion VPC2 may be substantially equal to the second width W2 of the second power connection portion VPC2 shown in FIG. 9. With this configuration, the plurality of power path portions VPC1 and VPC2 connecting the first power connection portion VSC1 and the second power connection portion VSC2 of the first power line VSL to each other can be secured without needing to prepare an additional space for the first power line VSL.

A spacing portion ES may be provided between the first power path portion VPC1 and the second power path portion VPC2 in the first direction (X-axis direction). The spacing portion ES may be defined as a planar area where the first power line VSL is not disposed. That is, each of the plurality of power path portions VPC1 and VPC2, the first power connection portion VSC1 and the second power connection portion VSC2 may be solid portions of the first power line VSL spaced apart from each other to define the spacing portion ES. Touch lines and scan fan-out lines SFL connected to a first scan driver SDC1 may be disposed in the spacing portion ES, and detailed description thereof will be made later with reference to FIG. 13.

Figure 12:
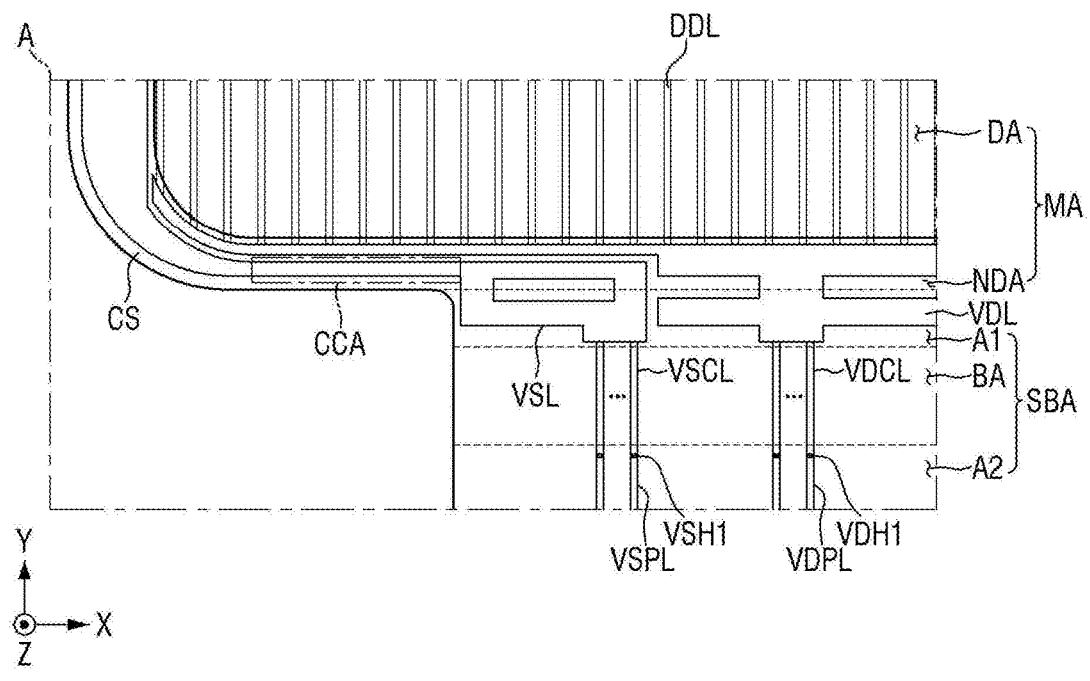
FIG. 12 is a plan view illustrating an embodiment of a non-display area of a display panel.

FIG. 12 is an enlarged plan view illustrating an embodiment of a non-display area NDA of a display panel 100 corresponding to area A in FIG. 2.

The embodiment of FIG. 12 is different from the embodiment of FIG. 10 in that a second power line VDL is disposed in a non-display area NDA, along the lower edge of a display area DA. In FIG. 12, redundant description of parts already described in the embodiment of FIG. 10 will be omitted.

Referring to FIG. 12, first display power lines DSL may be omitted in the display area DA, and second display power lines DDL may be disposed therein. The second display power lines DDL may extend from the second power line VDL in the second direction (Y-axis direction). A first power line VSL may be disposed under the second power line VDL. The second power line VDL may be disposed between the display area DA and the first power line VSL at the lower side of the display area DA. The second display power lines DDL allow a second power voltage to be applied to pixels PX in the display area DA more uniformly.

The second display power lines DDL may be arranged in a mesh shape (or net shape) in the display area DA. In this case, the second display power lines DDL may be arranged in different material layers, and may intersect with each other.

Figure 13:
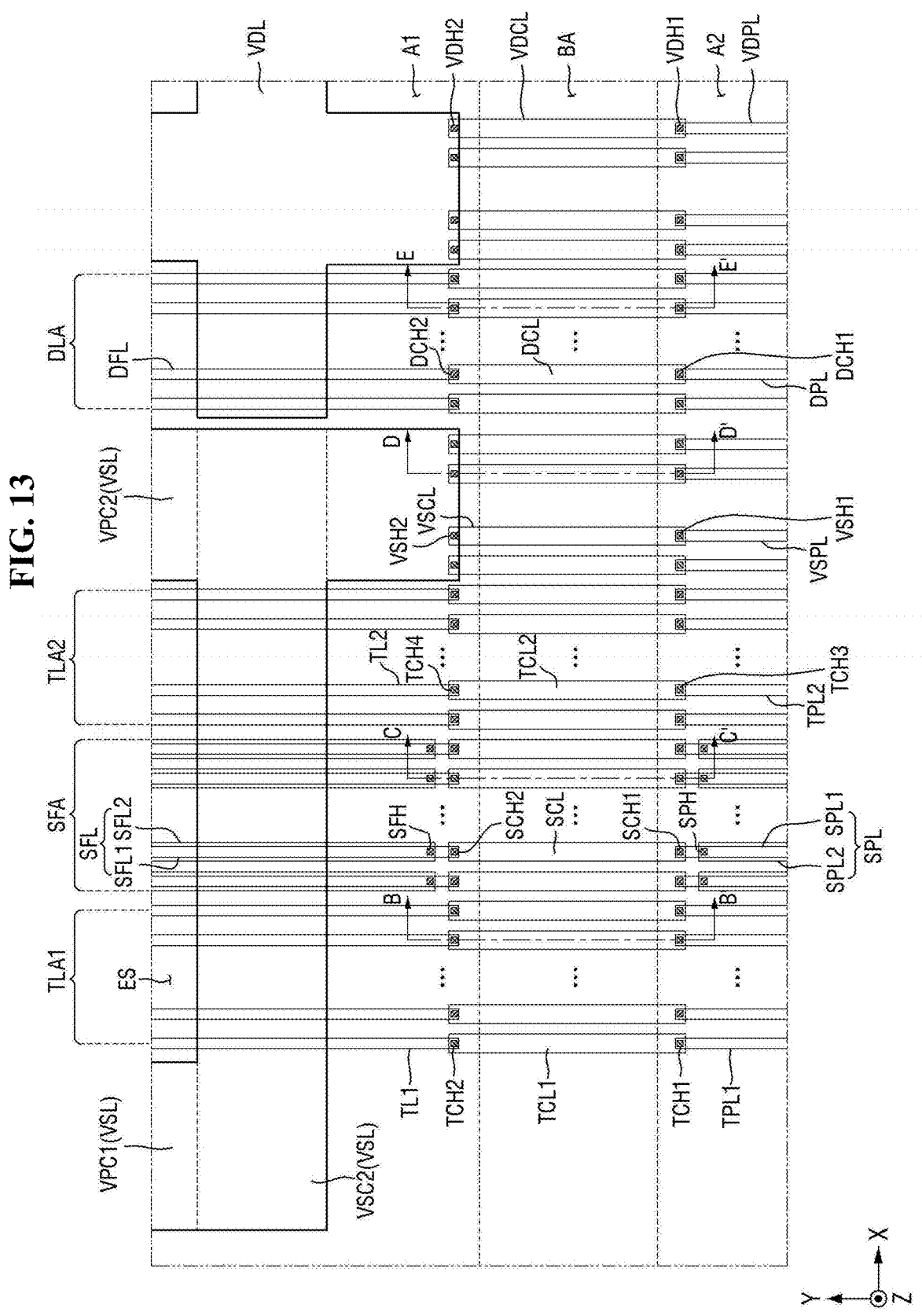
FIG. 13 is a plan view illustrating an embodiment of first touch lines, scan fan-out lines, second touch lines, data fan-out lines, a first power line, and a second power line.

FIG. 13 is an enlarged plan view illustrating first touch lines TL1, scan fan-out lines SFL, second touch lines TL2, data fan-out lines DFL, a first power line VSL, and a second power line VDL.

Referring to FIG. 13, first touch lines TL1, scan fan-out lines SFL, second touch lines TL2, data fan-out lines DFL, the first power line VSL, and the second power line VDL may be arranged in the first area A1.

The first touch lines TL1, the scan fan-out lines SFL, and the second touch lines TL2 may overlap the second power connection portion VSC2 of the first power line VSL in the first area A1. Further, in the first area A1, the first touch lines TL1, the scan fan-out lines SFL and the second touch lines TL2 may be arranged along the first direction (X-axis direction) in the spacing portion ES between the first power path portion VPC1 and the second power path portion VPC2.

In the first area A1, the overlap area between the first power line VSL and the first touch lines TL1, the overlap area between the first power line VSL and the scan fan-out lines SFL, and the overlap area between the first power line VSL and the second touch lines TL2 can be minimized due to the spacing portion ES. Therefore, parasitic capacitance between the first power line VSL and the first touch lines TL1, parasitic capacitance between the first power line VSL and the scan fan-out lines SFL, and parasitic capacitance between the first power line VSL and the second touch lines TL2 can be minimized due to the spacing portion ES where a solid portion of the first power line VSL is excluded. Hence, influence upon the first power voltage of the first power line VSL from the first touch lines TL1, the scan fan-out lines SFL and the second touch lines TL2 can be reduced.

The first touch lines TL1 may be defined as touch lines connected to first touch electrodes, among a plurality of touch electrodes including the driving electrodes TE and the first sensing electrodes RE shown in FIG. 6. The second touch lines TL2 may be defined as touch lines connected to second touch electrodes, among the plurality touch electrodes including the driving electrodes TE and the sensing electrodes RE shown in FIG. 6. In an embodiment, for example, the first touch line TL1 may be defined as a touch line connected to the driving electrode TE as a first touch electrode, and the second touch line TL2 may be defined as a touch line connected to the sensing electrode RE as a second touch electrode. Alternatively, the first touch line TL1 may be defined as a touch line connected to the sensing electrode RE, and the second touch line TL2 may be defined as a touch line connected to the driving electrode TE. Alternatively, the first touch line TL1 may be defined as a touch line connected to any one of the driving electrodes TE, and the second touch line TL2 may be defined as a touch line connected to another one of the driving electrodes TE. Still alternatively, the first touch line TL1 may be defined as a touch line connected to any one of the sensing electrodes RE, and the second touch line TL2 may be defined as a touch line connected to another one of the sensing electrodes RE.

In the first area A1, a region where the first touch lines TL1 are arranged may be defined as a first touch line area TLA1, a region where the scan fan-out lines SFL are arranged may be defined as a scan fan-out area SFA, a region where the second touch lines TL2 are arranged may be defined as a second touch line area TLA2, and a region where the data fan-out lines DFL are arranged may be defined as a data fan-out area DLA. In the first area A1, the first touch line area TLA1, the scan fan-out area SFA and the second touch line area TLA2 may be arranged in order along the first direction (X-axis direction). In the first area A1, the scan fan-out area SFA may be disposed between the first touch line area TLA1 and the second touch line area TLA2 in the first direction (X-axis direction).

The data fan-out area DLA may include data fan-out lines DFL connected to the data lines of the display area DA. The data fan-out lines DFL may overlap the second power line VDL in the first area A1. The data fan-out lines DFL may not overlap the first power line VSL in the first area A1, that is, may be spaced apart from the first power line VSL. In the first area A1, the data fan-out lines DFL may be disposed between the second power path portion VPC2 of the first power line VSL and the second power line VDL in the first direction (X-axis direction).

First touch connection lines TCL1, the scan connection lines SCL, second touch connection lines TCL2, data connection lines DCL, the first power connection lines VSCL, and the second power connection lines VDCL may be arranged in the bending area BA. First touch pad lines TPL1, the scan pad lines SPL, second touch pad lines TPL2, data pad lines DPL, the first power pad lines VSPL, and the second power pad lines VDPL may be arranged in the second area A2.

The first touch connection line TCL1 may be connected to the first touch line TL1 and the first touch pad line TPL1 corresponding thereto. The first touch connection line TCL1 may be connected to the first touch pad line TPL1 corresponding thereto through a first touch connection hole TCH1 in the second area A2. The first touch connection line TCL1 may be connected to the first touch line TL1 corresponding thereto through a second touch connection hole TCH2 in the first area A1.

The scan connection line SCL may be connected to the scan fan-out line SFL and the scan pad line SPL corresponding thereto. The scan fan-out line SFL may include a first scan fan-out line SFL1 together with a second scan fan-out line SFL2 which overlap each other in the third direction (Z-axis direction). The scan pad line SPL may include a first scan pad line SPL1 and a second scan pad line SPL2 which overlap each other in the third direction (Z-axis direction). The scan connection line SCL may be connected to the first scan pad line SPL1 corresponding thereto through a first scan connection hole SCH1 in the second area A2. The first scan pad line SPL1 may be connected to the second scan pad line SPL2 corresponding thereto through a scan pad hole SPH in the second area A2. The scan connection line SCL may be connected to the first scan fan-out line SFL1 corresponding thereto through a second scan connection hole SCH2 in the first area A1. The first scan fan-out line SFL1 may be connected to the second scan fan-out line SFL2 corresponding thereto through a scan fan-out hole SFH.

The second touch connection line TCL2 may be connected to the second touch line TL2 and the second touch pad line TPL2 corresponding thereto. The second touch connection line TCL2 may be connected to the second touch pad line TPL2 corresponding thereto through a third touch connection hole TCH3 in the second area A2. The second touch connection line TCL2 may be connected to the second touch line TL2 corresponding thereto through a fourth touch connection hole TCH4 in the first area A1.

The first power connection line VSCL may be connected to the second power connection portion VSC2 of the first power line VSL and the first power pad line VSPL corresponding thereto. The first power connection line VSCL may be connected to the first power pad line VSPL corresponding thereto through the first power connection hole VSH1 in the second area A2. The first power line connection line VSCL may be connected to the second power connection portion VSC2 of the first power line VSL through the third power connection hole VSH2 in the first area A1.

The data connection line DCL may be connected to the data fan-out line DFL and the data pad line DPL corresponding thereto. The data connection line DCL may be connected to the data pad line DPL corresponding thereto through a first data connection hole DCH1 in the second area A2. The data connection line DCL may be connected to the data fan-out line DFL corresponding thereto through a second data connection hole DCH2 in the first area A1.

The second power connection line VDCL may be connected to the second power line VDL and the second power pad line VDPL corresponding thereto. The second power connection line VDCL may be connected to the second power pad line VDPL corresponding thereto through the second power connection hole VDH1 in the second area A2. The second power connection line VDCL may be connected to the second power line VDL through the fourth power connection hole VDH2 in the first area A1.

Figure 14A:
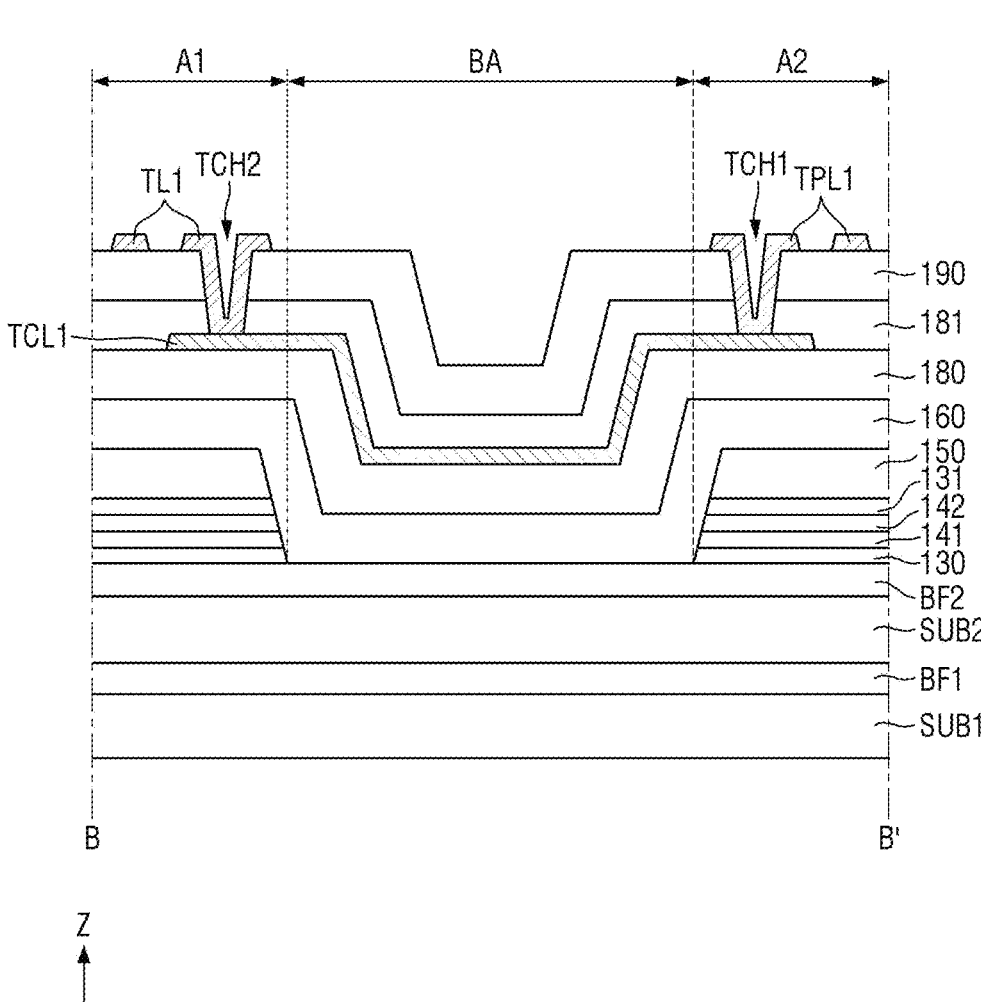
FIG. 14A is a cross-sectional view illustrating an embodiment of a display panel taken along line B-B' of FIG. 13.
Figure 14B:
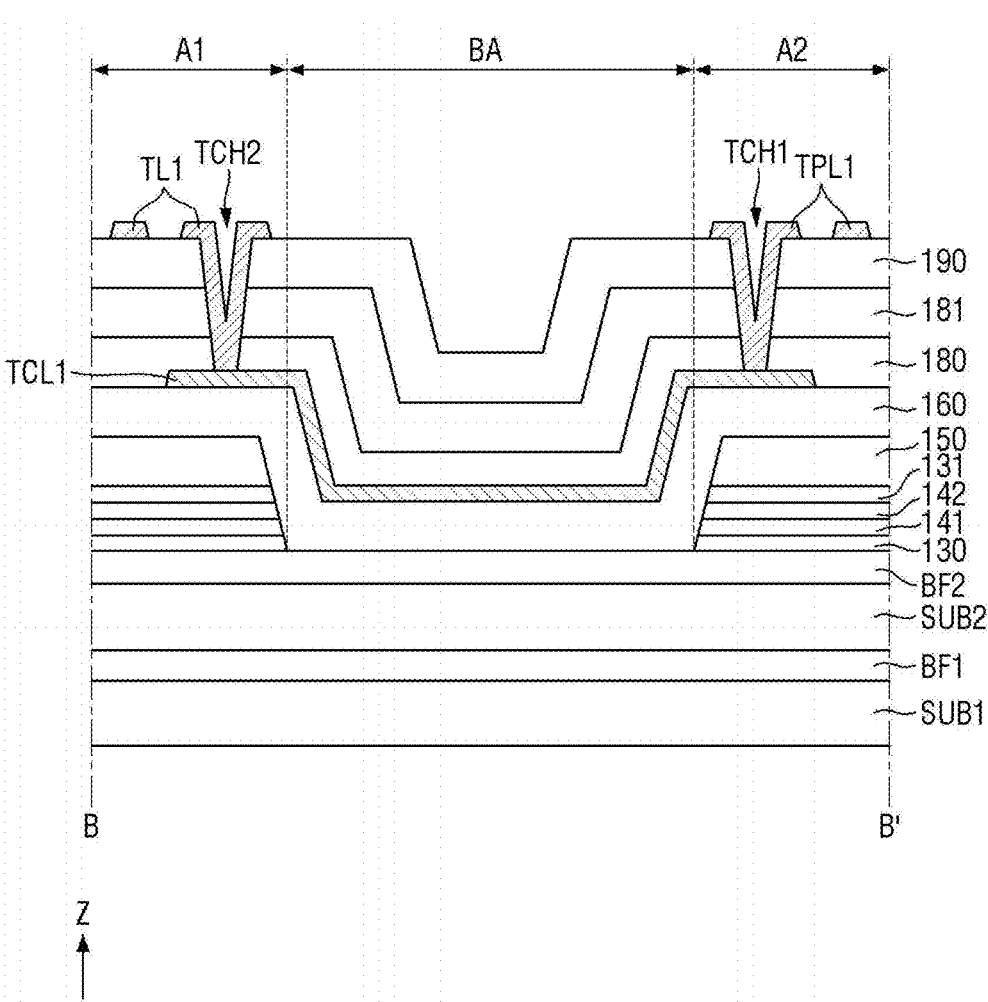
FIG. 14B is a cross-sectional view illustrating an embodiment of a display panel taken along line B-B' of FIG. 13.

FIG. 14A is a cross-sectional view illustrating an embodiment of a display panel 100 taken along line B-B' of FIG. 13. FIG. 14B is a cross-sectional view illustrating an embodiment of a display panel 100 taken along line B-B' of FIG. 13.

Referring to FIG. 14A, the first touch connection line TCL1 may be disposed on the second organic layer 180, and the first touch line TL1 and the first touch pad line TPL1 may be disposed on the bank 190. In this case, the first touch connection line TCL1 may include substantially the same material as the third anode connection electrode ANDE3 shown in FIG. 7. Further, the first touch line TL1 and the first touch pad line TPL1 may include substantially the same material as the driving electrodes TE and the sensing electrodes RE shown in FIG. 7. Furthermore, each of the first touch connection hole TCH1 and the second touch connection hole TCH2 may be a hole formed through the third organic layer 181 and the bank 190 to allow the first touch connection line TCL1 to be exposed therethrough.

In addition, as shown in FIG. 14B, the first touch connection line TCL1 may be disposed on the first organic layer 160. In this case, the first touch connection line TCL1 may include substantially the same material as the second anode connection electrode ANDE2 shown in FIG. 7. Further, each of the first touch connection hole TCH1 and the second touch connection hole TCH2 may be a hole formed through the second organic layer 180, the third organic layer 181 and the bank 190 to allow the first touch connection line TCL1 to be exposed therethrough.

The first gate insulating layer 130, the first interlayer insulating layer 141, the second interlayer insulating layer 142, the second gate insulating layer 131, and the third interlayer insulating layer 150 may be eliminated at the bending area BA to prevent formation of a crack in the bending area BA. In such a case, the first organic layer 160, the second organic layer 180, the third organic layer 181, and the bank 190 may be disposed in the bending area BA.

Further, though FIGS. 14A and 14B exemplarily illustrate the second barrier layer BF2 disposed in the bending area BA, however, the second barrier layer BF2 may be eliminated from the bending area BA to prevent formation of a crack in the bending area BA. Moreover, the bank 190 may be omitted from the first area A1, the second area A2 and the bending area BA.

Since the second touch line TL2, the second touch connection line TCL2, the second touch pad line TPL2, the third touch connection hole TCH3, and the fourth touch connection hole TCH4 illustrated in FIG. 13 are substantially the same as the first touch line TL1, the first touch connection line TCL1, the first touch pad line TPL1, the first touch connection hole TCH1, and the second touch connection hole TCH2 described with reference to FIGS. 14A and 14B, redundant description thereof will be omitted.

Figure 15A:
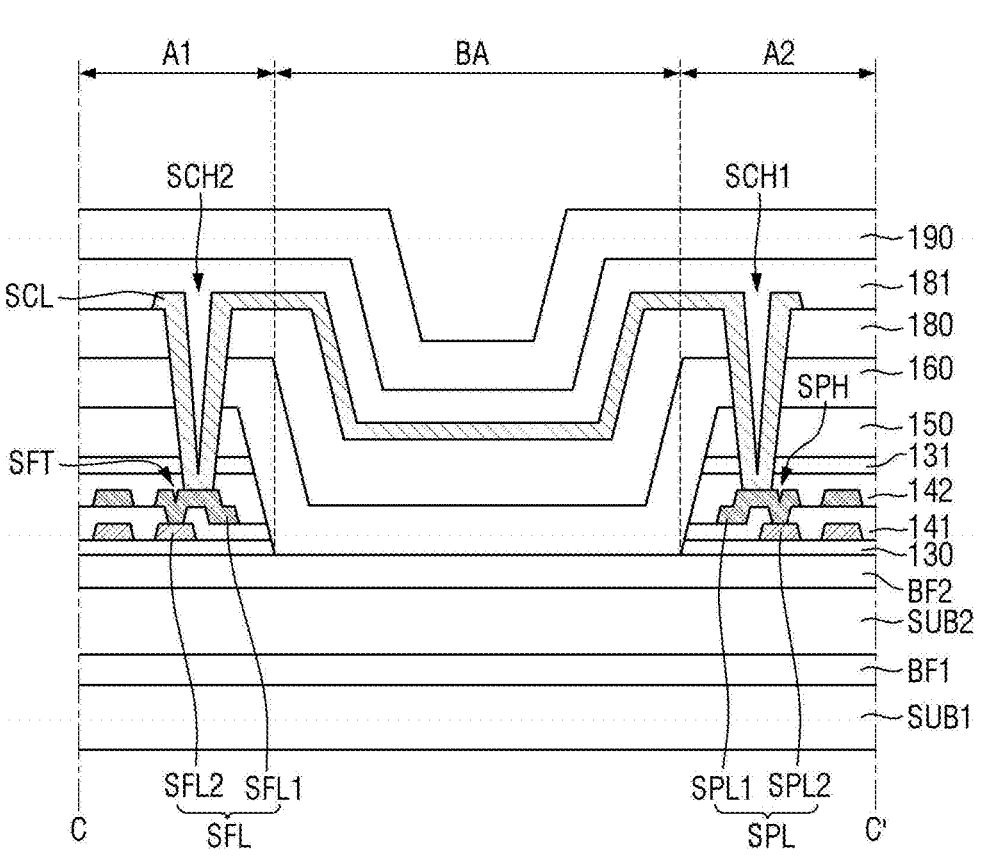
FIG. 15A is a cross-sectional view illustrating an embodiment of a display panel taken along line C-C' of FIG. 13.
Figure 15B:
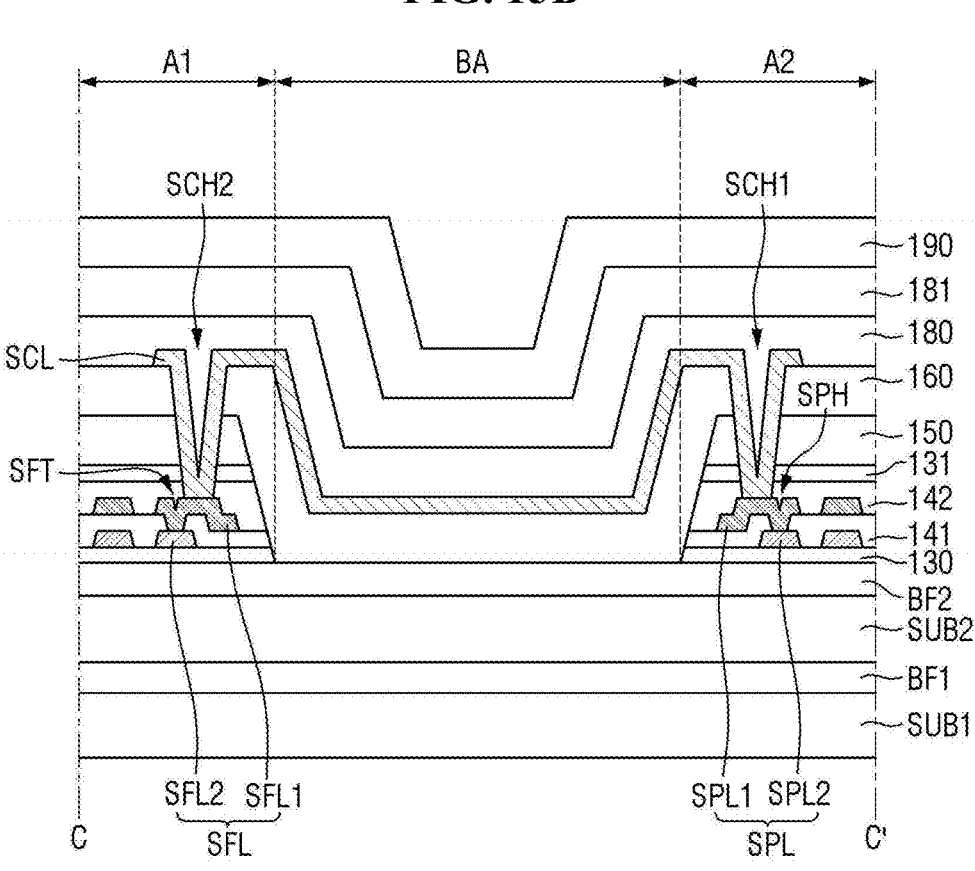
FIG. 15B is a cross-sectional view illustrating an embodiment of a display panel taken along line C-C' of FIG. 13.

FIG. 15A is a cross-sectional view illustrating an embodiment of a display panel 100 taken along line C-C' of FIG. 13. FIG. 15B is a cross-sectional view illustrating an embodiment of a display panel 100 taken along line C-C' of FIG. 13.

Referring to FIGS. 15A and 15B, the first scan fan-out line SFL1 and the first scan pad line SPL1 may be disposed on the first interlayer insulating layer 141, and the second scan fan-out line SFL2 and the second scan pad line SPL2 may be disposed on the first gate insulating layer 130. The first scan fan-out line SFL1 and the first scan pad line SPL1 may include the same material as the second capacitor electrode CAE2. The second scan fan-out line SFL2 and the second scan pad line SPL2 may include the same material as the first capacitor electrode CAE1 and the first gate electrode G1 of the first thin film transistor TFT1. The scan fan-out hole SFH and the scan pad hole SPH may be holes formed through the first interlayer insulating layer 141.

As illustrated in FIG. 15A, the scan connection line SCL may be disposed on the second organic layer 180. In this case, the scan connection line SCL may include substantially the same material as the third anode connection electrode ANDE3 shown in FIG. 7. Further, each of the first scan connection hole SCH1 and the second scan connection hole SCH2 may be a hole formed through the second gate insulating layer 131, the third interlayer insulating layer 150, the first organic layer 160, and the second organic layer 180.

Alternatively, the scan connection line SCL may be disposed on the first organic layer 160, as depicted in FIG. 15B. In this case, the scan connection line SCL may include substantially the same material as the second anode connection electrode ANDE2 shown in FIG. 7. Further, each of the first scan connection hole SCH1 and the second scan connection hole SCH2 may be a hole formed through the second gate insulating layer 131, the third interlayer insulating layer 150, and the first organic layer 160.

Figure 16A:
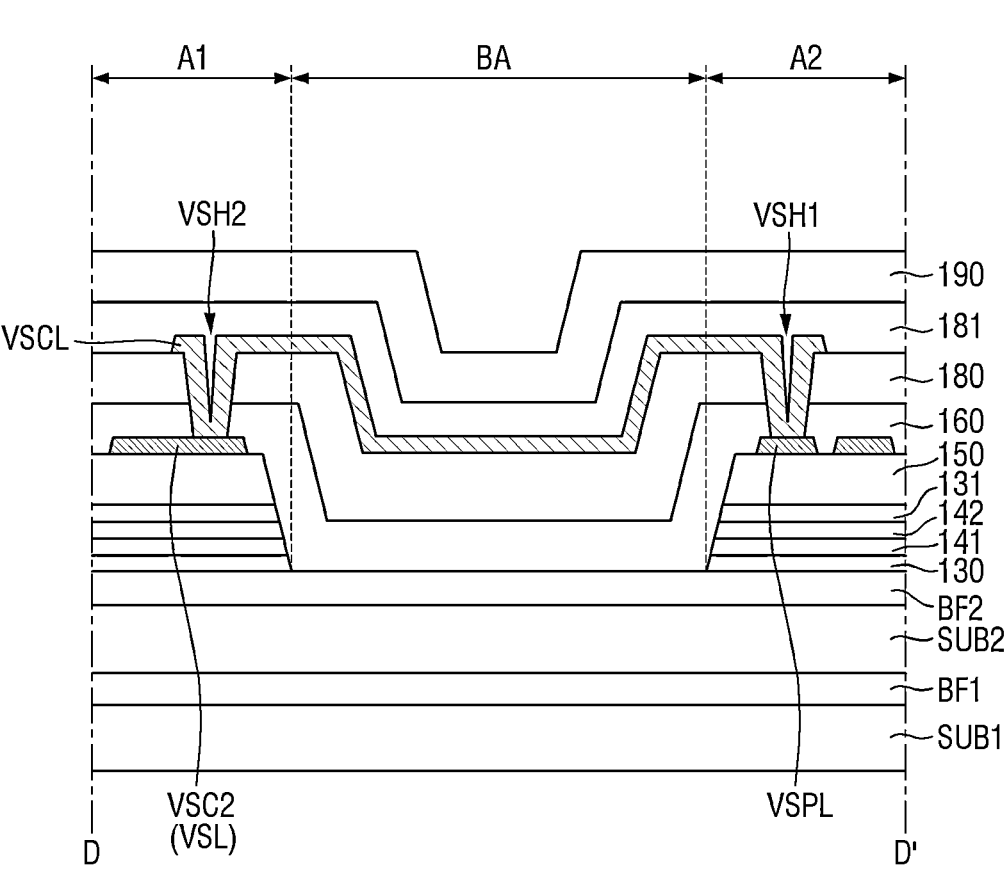
FIG. 16A is a cross-sectional view illustrating an embodiment of a display panel taken along line D-D' of FIG. 13.
Figure 16B:
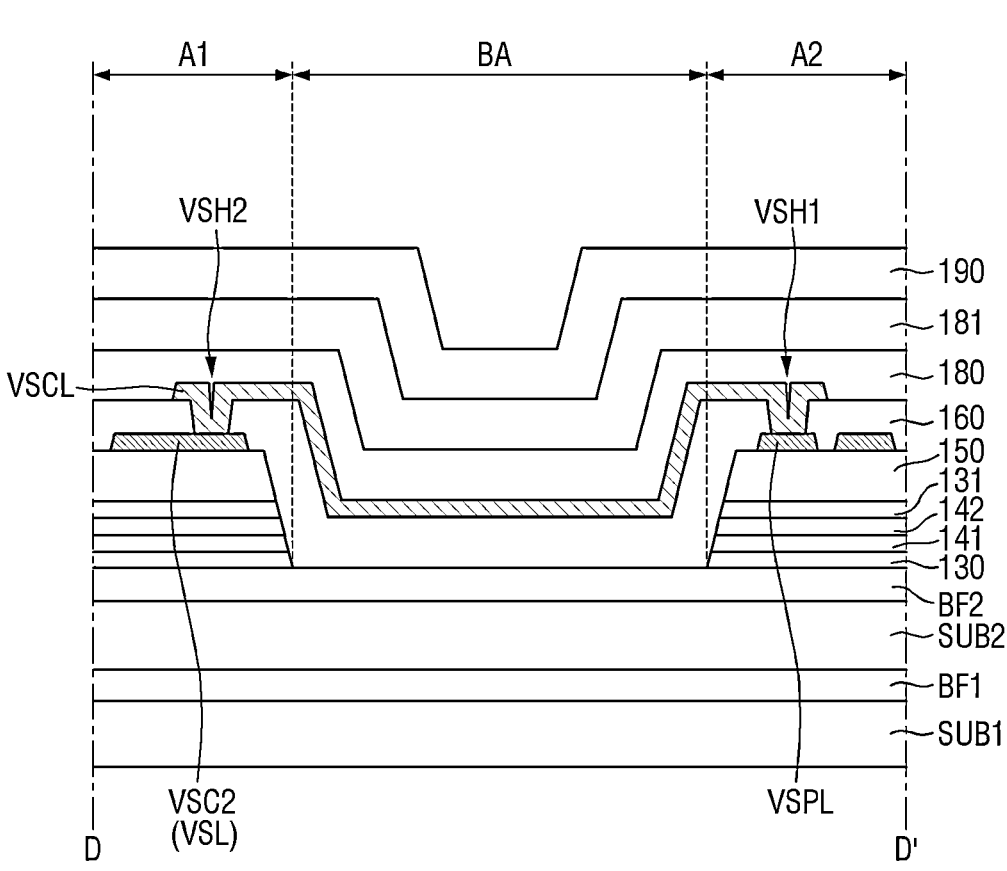
FIG. 16B is a cross-sectional view illustrating an embodiment of a display panel taken along line D-D' of FIG. 13.

FIG. 16A is a cross-sectional view illustrating an embodiment of a display panel 100 taken along line D-D' of FIG. 13. FIG. 16B is a cross-sectional view illustrating an embodiment of a display panel 100 taken along line D-D' of FIG. 13.

Referring to FIGS. 16A and 16B, the first power line VSL and the first power pad lines VSPL may be disposed on the third interlayer insulating layer 150. The first power line VSL and the first power pad lines VSPL may include the same material as the first anode connection electrode ANDE1, the first connection electrode BE1, and the second connection electrode BE2 shown in FIG. 7.

Alternatively, the first power line VSL may include a first sub power line (not shown) disposed on the first organic layer 160 and a second sub power line (not shown) disposed on the third interlayer insulating layer 150 to reduce electrical resistance. In this case, each of the first power pad lines VSPL may include a first sub power pad line disposed on the first organic layer 160 and a second sub power pad line disposed on the third interlayer insulating layer 150.

As depicted in FIG. 16A, the first power connection line VSCL may be disposed on the second organic layer 180. In this case, the first power connection line VSCL may include substantially the same material as the third anode connection electrode ANDE3 shown in FIG. 7. Further, each of the first power connection hole VSH1 and the third power connection hole VSH2 may be a hole formed through the first organic layer 160 and the second organic layer 180.

Alternatively, as shown in FIG. 16B, the first power connection line VSCL may be disposed on the first organic layer 160. In this case, the first power connection line VSCL may include substantially the same material as the second anode connection electrode ANDE2 shown in FIG. 7. Further, each of the first power connection hole VSH1 and the third power connection hole VSH2 may be a hole formed through the first organic layer 160.

Since the second power line VDL, the second power connection line VDCL, the second power pad line VDPL, the second power connection hole VDH1, and the fourth power connection hole VDH2 are substantially the same as the first power line VSL, the first power connection line VSCL, the first power pad line VSPL, the first power connection hole VSH1, and the third power connection hole VSH2 described with reference to FIG. 16A, redundant description thereof will be omitted.

Figure 17A:
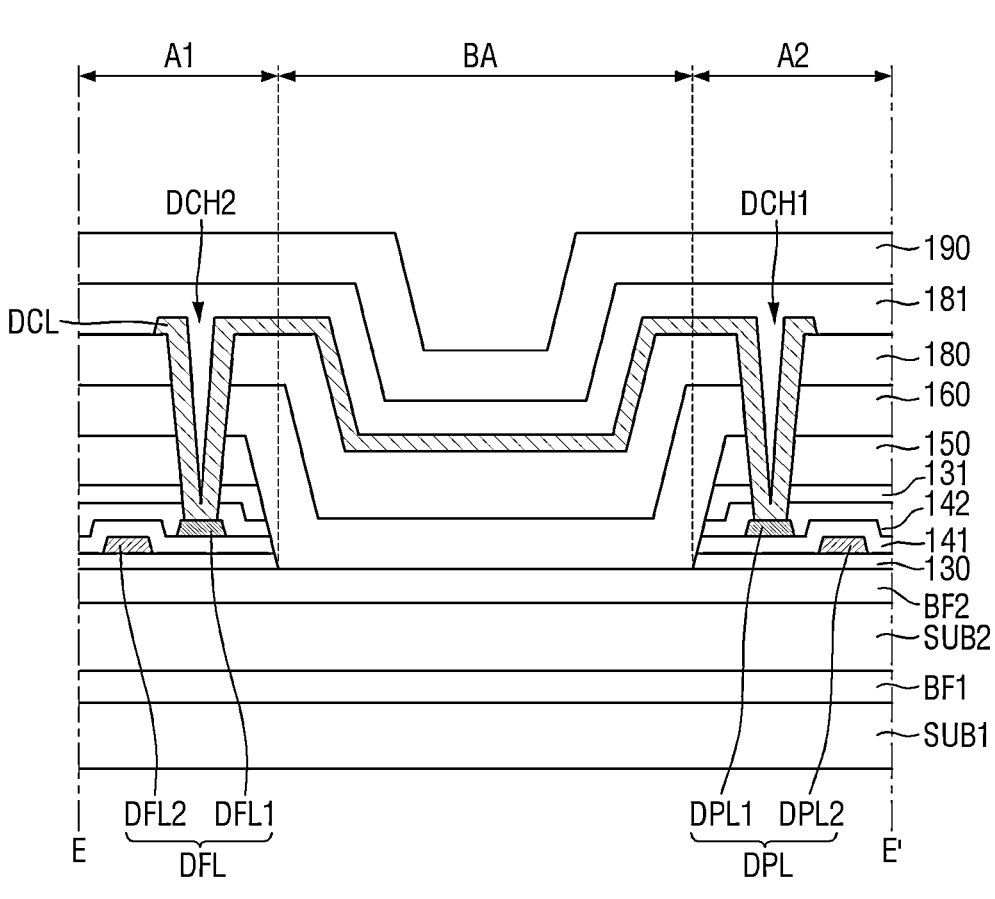
FIG. 17A is a cross-sectional view illustrating an embodiment of a display panel taken along line E-E' of FIG. 13.
Figure 17B:
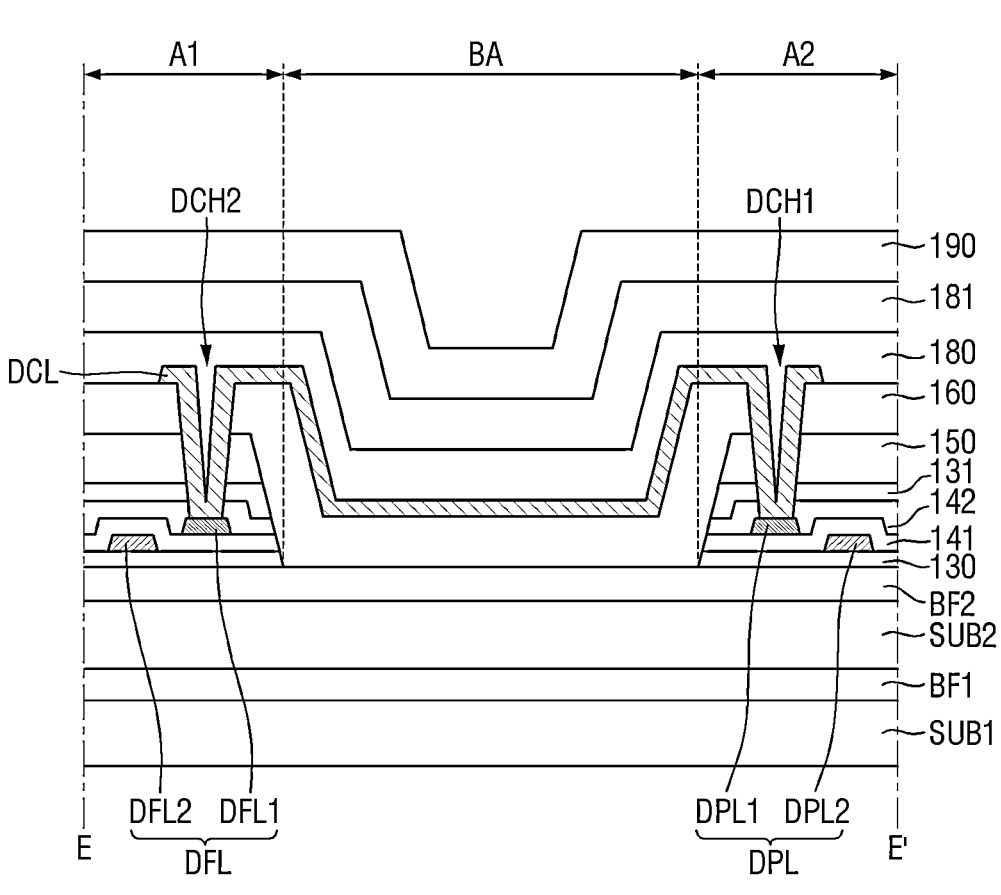
FIG. 17B is a cross-sectional view illustrating an embodiment of a display panel taken along line E-E' of FIG. 13.

FIG. 17A is a cross-sectional view illustrating an embodiment of a display panel 100 taken along line E-E' of FIG. 13. FIG. 17B is a cross-sectional view illustrating an embodiment of a display panel 100 taken along line E-E' of FIG. 13.

Referring to FIGS. 17A and 17B, the data fan-out lines DFL may include first data fan-out lines DFL1 disposed on the first gate insulating layer 130, and second data fan-out lines DFL2 disposed on the first interlayer insulating layer 141. The first data fan-out lines DFL1 and the second data fan-out lines DFL2 may be arranged alternately in the first direction (X-axis direction).

The data pad lines DPL may include first data pad lines DPL1 disposed on the first gate insulating layer 130, and second data pad lines DPL2 disposed on the first interlayer insulating layer 141. The first data pad lines DPL1 and the second data pad lines DPL2 may be arranged alternately in the first direction (X-axis direction).

As illustrated in FIG. 17A, the data connection line DCL may be disposed on the second organic layer 180. In this case, the data connection line DCL may include substantially the same material as the third anode connection electrode ANDE3 shown in FIG. 7. Further, each of the first data connection hole DCH1 connected to the second data fan-out line DFL2 and the second data connection hole DCH2 connected to the second data pad line DPL2 may be a hole formed through the second interlayer insulating layer 142, the second gate insulating layer 131, the third interlayer insulating layer 150, the first organic layer 160, and the second organic layer 180. Moreover, each of the first data connection hole DCH1 connected to the first data fan-out line DFL1 and the second data connection hole DCH2 connected to the first data pad line DPL1 may be a hole formed through the first interlayer insulating layer 141, the second interlayer insulating layer 142, the second gate insulating layer 131, the third interlayer insulating layer 150, the first organic layer 160, and the second organic layer 180.

Alternatively, as depicted in FIG. 17B, the data connection line DCL may be disposed on the first organic layer 160. In this case, the data connection line DCL may include substantially the same material as the second anode connection electrode ANDE2 shown in FIG. 7. Further, each of the first data connection hole DCH1 connected to the second data fan-out line DFL2 and the second data connection hole DCH2 connected to the second data pad line DPL2 may be a hole formed through the second interlayer insulating layer 142, the second gate insulating layer 131, the third interlayer insulating layer 150, and the first organic layer 160. Further, each of the first data connection hole DCH1 connected to the first data fan-out line DFL1 and the second data connection hole DCH2 connected to the first data pad line DPL1 may be a hole formed through the first interlayer insulating layer 141, the second interlayer insulating layer 142, the second gate insulating layer 131, the third interlayer insulating layer 150, and the first organic layer 160.

Figure 18:
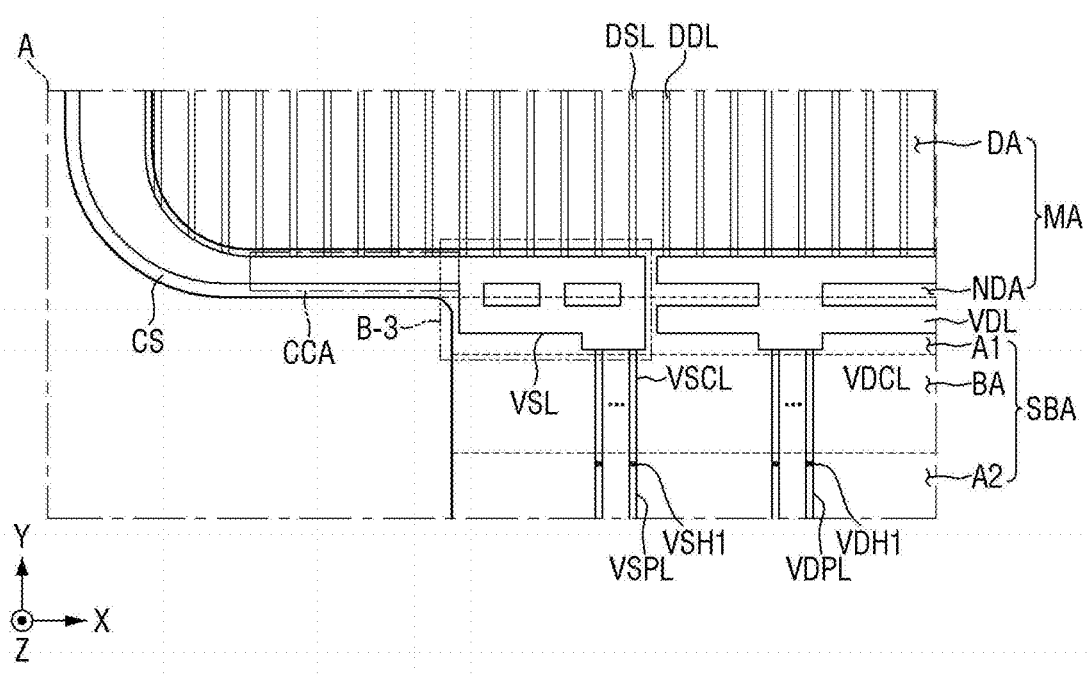
FIG. 18 is a plan view illustrating an embodiment of a non-display area of a display panel.
Figure 19:
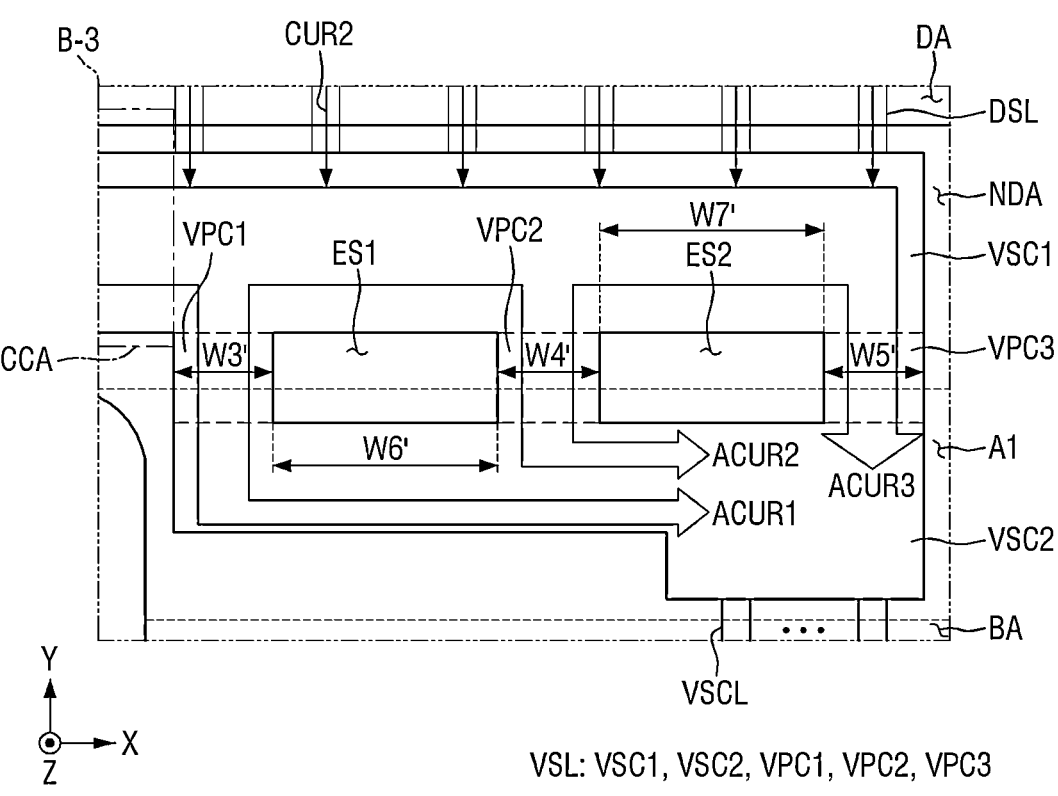
FIG. 19 is a plan view showing an embodiment of a first power line of area B-3 of FIG. 18.

FIG. 18 is an enlarged plan view illustrating a non-display area NDA of a display panel 100 corresponding to area A in FIG. 2. FIG. 19 is an enlarged plan view showing in detail a first power line VSL of area B-3 of FIG. 18.

Embodiment shown in FIGS. 18 and 19 are different from the embodiment of FIGS. 10 and 11 in that a first power line VSL includes three power path portions VPC1, VPC2, and VPC3. In the description made with reference to FIGS. 18 and 19, redundant parts of the description with reference to FIGS. 10 and 11 will be omitted.

Referring to FIGS. 18 and 19, the first power line VSL may include a first power connection portion VSC1, a second power connection portion VSC2, a first power path portion VPC1, a second power path portion VPC2, and a third power path portion VPC3.

Since the first power connection portion VSC1 and the second power connection portion VSC2 are substantially the same as described with reference to FIGS. 10 and 11, redundant description thereof will be omitted here.

The first power path portion VPC1, the second power path portion VPC2, and the third power path portion VPC3 may be disposed between the first power connection portion VSC1 and the second power connection portion VSC2. The first power path portion VPC1, the second power path portion VPC2, and the third power path portion VPC3 may extend in the second direction (Y-axis direction). The first power path portion VPC1 may be disposed closer to the edge of a display panel 100 than the second power path portion VPC2 is, and the second power path portion VPC2 may be disposed closer to the edge of the display panel 100 than the third power path portion VPC3.

Since the plurality of power path portions VPC1, VPC2 and VPC3 are disposed between the first power connection portion VSC1 and the second power connection portion VSC2, an electric current concentrated to a current concentration area CCA of the first power line VSL may be allowed to flow to the second power connection portion VSC2 through the second power path portion VPC2 and the third power path portion VPC3 as well as the first power path portion VPC1. Thus, the area of the current concentration area CCA of the first power line VSL can be reduced. Further, due to the reduction of the planar area of the current concentration area CCA of the first power line VSL, the amount of heat generated in the current concentration area CCA of the first power line VSL can be reduced. Thus, degradation of pixels PX in a display area DA adjacent to the first power line VSL can be reduced.

A third width W3' of the first power path portion VPC1 may be larger than a fourth width W4' of the second power path portion VPC2, and the fourth width W4' of the second power path portion VPC2 may be larger than a fifth width W5' of the third power path portion VPC3. In an embodiment, for example, the ratio between the third width W3' of the first power path portion VPC1, the fourth width W4' of the second power path portion VPC2, and the fifth width W5' of the third power path portion VPC3 may be about 5:3:2. In this case, the magnitude of a first added current ACUR1 passing through the first power path portion VPC1 may be larger than the magnitude of a second added current ACUR2 passing through the second power path portion VPC2, and the magnitude of the second added current ACUR2 may be larger than a third added current ACUR3 passing through the third power path portion VPC3. However, the embodiment of the present disclosure is not limited thereto, and the third width W3' of the first power path portion VPC1 may be equal to or smaller than the fourth width W4' of the second power path portion VPC2, and the fourth width W4' of the second power path portion VPC2 may be equal to or smaller than the fifth width W5' of the third power path portion VPC3.

The sum of the third width W3' of the first power path portion VPC1, the fourth width W4' of the second power path portion VPC2, and the fifth width W5' of the third power path portion VPC3 may be substantially equal to the second width W2 of the second power connection portion VPC2 shown in FIG. 9. Thus, it is possible to secure the plurality of power path portions VPC1, VPC2 and VPC3 connecting the first power connection portion VSC1 and the second power connection portion VSC2 of the first power line VSL to each other, without needing to prepare an additional space (e.g., planar area) for the first power line VSL.

A first spacing portion ES1 (e.g., first opening) may be provided between the first power path portion VPC1 and the second power path portion VPC2 in the first direction (X-axis direction), and a second spacing portion ES2 (e.g., second opening) may be provided between the second power path portion VPC2 and the third power path portion VPC3 in the first direction (X-axis direction). The first spacing portion ES1 and the second spacing portion ES2 may be planar areas where the first power line VSL is not disposed (e.g., solid portions of the first power line VSL omitted).

A sixth width W6' of the first spacing portion ES1 may be smaller than a seventh width W7' of the second spacing portion ES2. If the sixth width W6' of the first spacing portion ES1 is small, the second power connection portion VPC2 may be disposed adjacent to the edge of a sub-region SBA. Thus, an electric current concentrated to a current concentration area CCA of the first power line VSL may be allowed to flow to the second power connection portion VSC2 through the second power connection portion VPC2. Thus, since the concentration of the electric current in the current concentration area CCA of the first power line VSL can be reduced, the temperature of the current concentration area CCA of the first power line VSL can be further reduced. Therefore, degradation of pixels PX in a display area DA adjacent to the first power line VSL can be reduced.

The sixth width W6' between the first power path portion VPC1 and the second power path portion VPC2 in the first direction (X-axis direction) may be smaller than the seventh width W7' between the second power path portion VPC2 and the third power path portion VPC3 in the first direction (X-axis direction). Accordingly, the number of wires at the first spacing portion ES1 may be less than the number of wires at the second spacing portion ES2. For reference, the sixth width W6' of the first spacing portion ES1 represents the length of the first spacing portion ES1 in the first direction (X-axis direction), and the seventh width W7' of the second spacing portion ES2 represents the length of the second spacing portion ES2 in the first direction (X-axis direction).

First touch lines TL1 and scan fan-out lines SFL connected to a first scan driver SDC1 may be disposed in the first spacing portion ES1, and second touch lines TL2 may be arranged in the second spacing portion ES2. A detailed description thereof will be given later with reference to FIG. 20.

Figure 20:
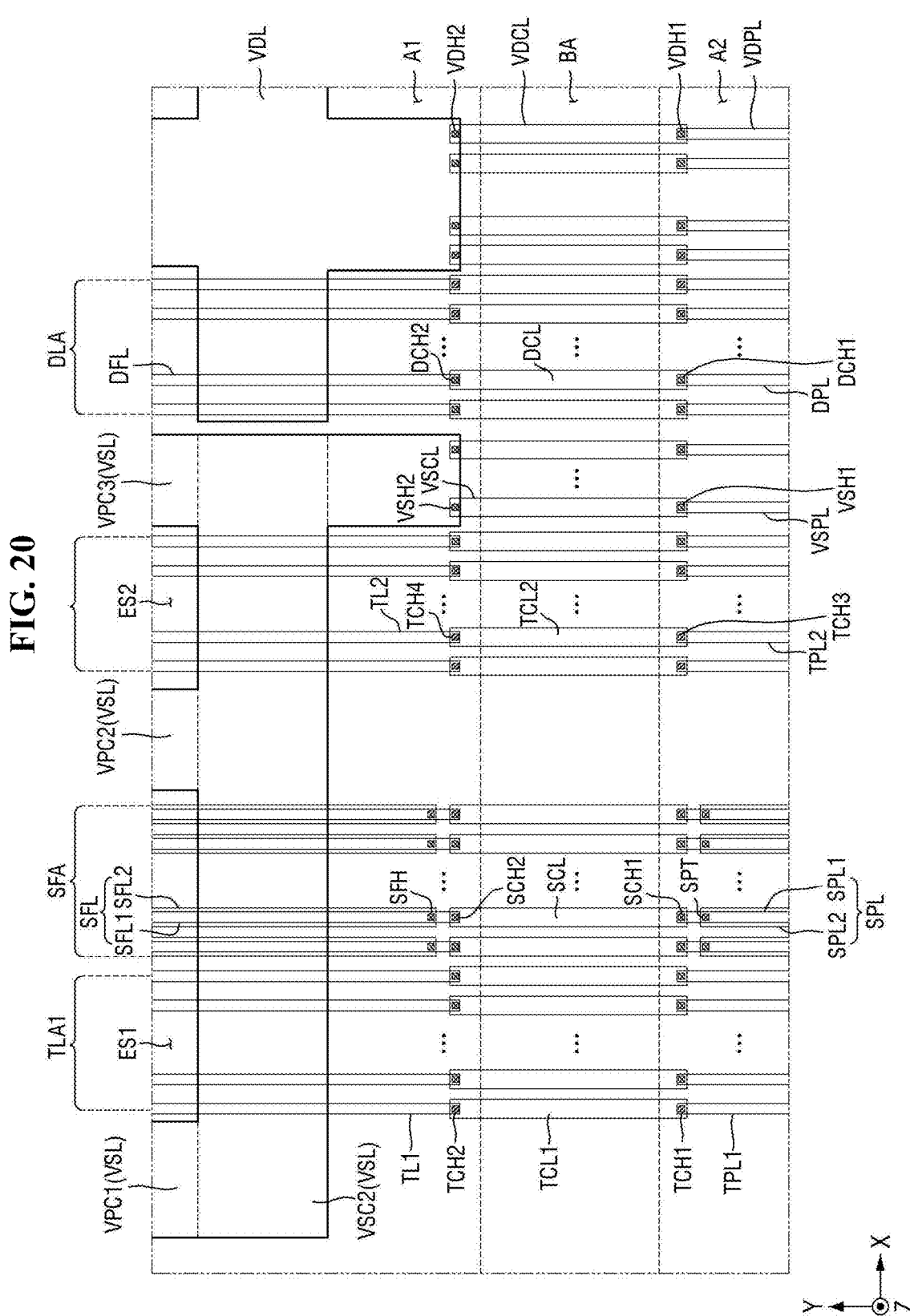
FIG. 20 is a plan view illustrating an embodiment of first touch lines, scan fan-out lines, second touch lines, data fan-out lines, a first power line, and a second power line.

FIG. 20 is an enlarged plan view illustrating an embodiment of first touch lines TL1, scan fan-out lines SFL, second touch lines TL2, data fan-out lines DFL, a first power line VSL, and a second power line VDL.

The embodiment of FIG. 20 is different from the embodiment of FIG. 13 in that first touch lines TL1 and scan fan-out lines SFL are disposed in a first spacing portion ES1, whereas second touch lines TL2 are disposed in a second spacing portion ES2. In the description of FIG. 20, redun-dant description of the parts already described in the embodiment of FIG. 13 will be omitted.

Referring to FIG. 20, in a first area A1, the overlap area between a first power line VSL and first touch lines TL1, and the overlap area between the first power line VSL and scan fan-out lines SFL can be minimized due to the first spacing portion ES1. Further, the overlap area between the first power line VSL and second power lines TL2 can be minimized due to the second spacing portion ES2. Thus, parasitic capacitance between the first power line VSL and the first touch lines TL1, and parasitic capacitance between the first power line VSL and the scan fan-out lines SFL can be minimized due to the first spacing portion ES1. Furthermore, parasitic capacitance between the first power line VSL and the second touch lines TL2 can be minimized due to the second spacing portion ES2. Thus, influence upon a first power voltage of the first power line VSL from the first touch lines TL1, the scan fan-out lines SFL and the second touch lines TL2 can be reduced.

In the first spacing portion ES1, a first touch line area TLA1 and a scan fan-out area SFA may be arranged in the first direction (X-axis direction). In the first spacing portion ES1, the first touch line area TLA1 may be disposed closer to the edge of a display panel 100 than the scan fan-out area SFA.

Figure 21:
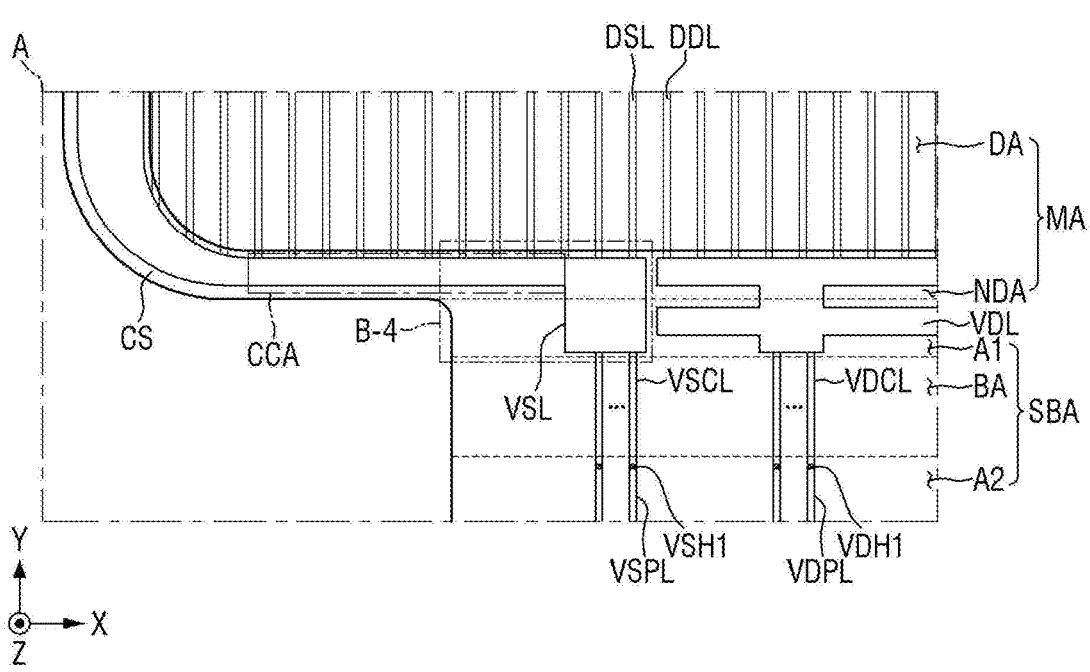
FIG. 21 is a plan view illustrating an embodiment of a non-display area of a display panel.
Figure 22:
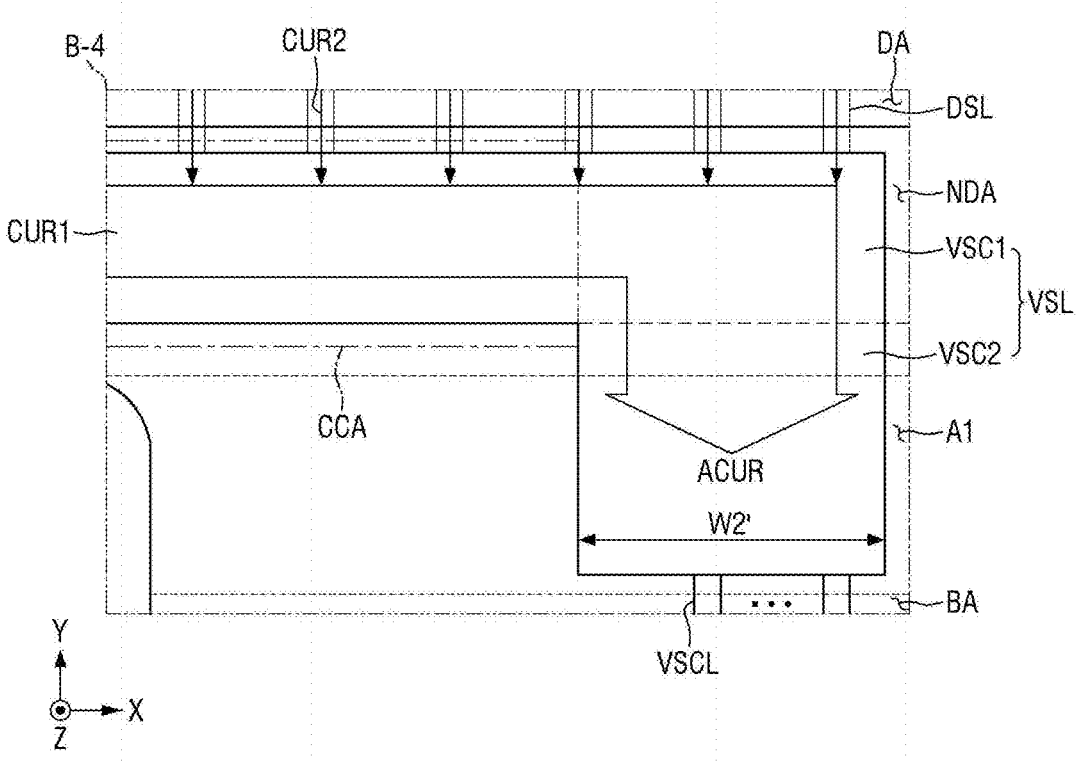
FIG. 22 is a plan view showing an embodiment of a first power line of area B-4 of FIG. 21.

FIG. 21 is an enlarged plan view illustrating an embodiment of a non-display area NDA of a display panel 100 corresponding to area A in FIG. 2. FIG. 22 is an enlarged plan view showing in detail an embodiment of a first power line VSL of area B-4 of FIG. 21.

The embodiment of FIGS. 21 and 22 are different from the embodiment of FIGS. 8 and 9 in that a second width W2' of a second connection portion VSC2 of a first power line VSL is enlarged. In the description made with reference to FIGS. 21 and 22, redundant parts of the description with reference to FIGS. 8 and 9 will be omitted.

Referring to FIGS. 21 and 22, by enlarging a second width W2' of the second power connection portion VSC2 to be larger than the second width W2 of the second power connection portion VSC2 shown in FIG. 9, the area of a current concentration area CCA of the first power line VSL can be reduced. Thus, since heat generated in the first power line VSL can be reduced, degradation of pixels PX in a display area DA adjacent to the first power line VSL due to the heat of the first power line VSL can be reduced.

Figure 23:
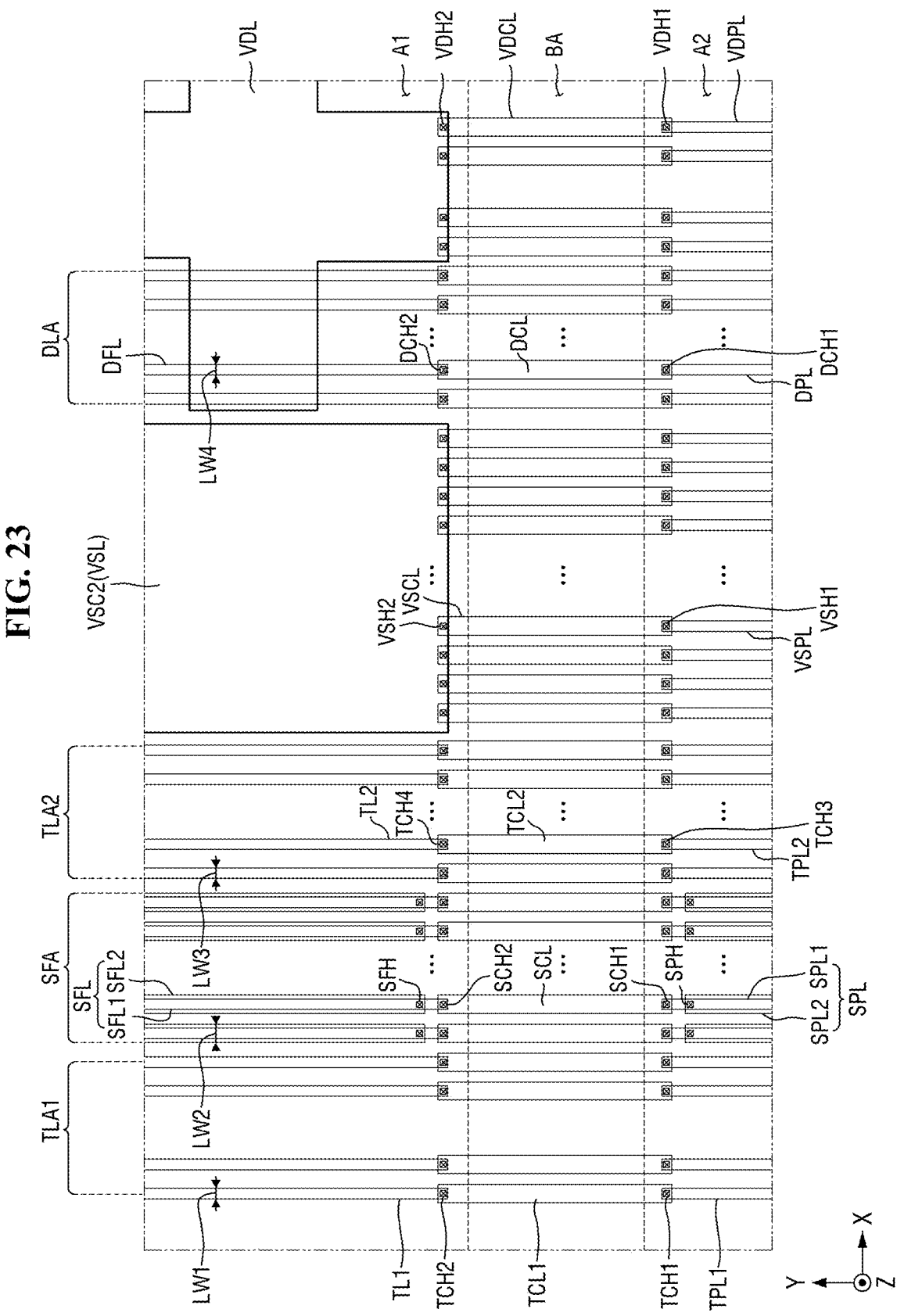
FIG. 23 is a plan view illustrating an embodiment of first touch lines, scan fan-out lines, second touch lines, data fan-out lines, a first power line, and a second power line.

FIG. 23 is an enlarged plan view illustrating first touch lines TL1, scan fan-out lines SFL, second touch lines TL2, data fan-out lines DFL, a first power line VSL, and a second power line VDL.

Referring to FIG. 23, a third line width LW3 of each of second touch lines TL2, a second line width LW2 of each of scan fan-out lines SFL, and a first line width LW1 of each of first touch lines TL1 which do not overlap a second power connection portion VSC2 in the third direction (Z-axis direction) can be minimized. In an embodiment, for example, the first line width LW1 of each of the first touch lines TL1, the second line width LW2 of each of the scan fan-out lines SFL, and the third line width LW3 of each of the second touch lines TL2 may be smaller than the fourth width LW4 of each of the data fan-out lines DFL. In this case, the length of a first touch line area TLA1 in the first direction (X-axis direction), the length of a scan fan-out area SFA in the first direction (X-axis direction), and the length of a second touch line area TLA2 in the first direction (X-axis direction) can be reduced. Therefore, the second width W2' of the second power connection portion VSC2 can be enlarged as much as the length of the first touch line area TLA1 in the first direction (X-axis direction) and the length of the second touch line area TLA2 in the first direction (X-axis direction) are reduced.

Alternatively, the second width W2' of the second power connection portion VSC2 can be enlarged by reducing the distance between the first touch lines TL1 in the first direction (X-axis direction), the distance between the scan fan-out lines SFL in the first direction (X-axis direction), and the distance between the second touch lines TL2 in the first direction (X-axis direction). By way of example, the distance between the first touch lines TL1 in the first direction (X-axis direction), the distance between the scan fan-out lines SFL in the first direction (X-axis direction), and the distance between the second touch lines TL2 in the first direction (X-axis direction) may be smaller than the distance between the data fan-out lines DFL in the first direction (X-axis direction).

However, the effects of the present disclosure are not restricted to the one set forth herein. The above and other effects of the present disclosure will become more apparent to one of daily skill in the art to which the present disclosure pertains by referencing the claims.

What is claimed is:

1. An electronic device comprising:
a display panel for displaying an image, and
the display panel comprises:
 a display area including a scan line, a data line and a pixel;
 a non-display area adjacent to a side of the display area;
 a non-display sub-region adjacent to the non-display area in a first direction; and
 a first power line configured to transmit a first power voltage to the pixel, the first power line including:
  in order from the side of the display area, in the first direction:
   a first power connection portion which is in the non-display area; and
   a second power connection portion which is in the non-display sub-region and spaced apart from the first power connection portion in the first direction; and
  a first power path portion and a second power path portion which are spaced apart from each other along a second direction crossing the first direction,
  wherein
  the first power path portion and the second power path portion are between the first power connection portion and the second power connection portion, in the first direction, and connect the first power connection portion and the second power connection portion to each other, and
   a spacing portion which is physically enclosed by the first power connection portion, the second power connection portion, the first power path portion and the second power path portion.

2. The electronic device of claim 1, wherein the display panel is used as a display screen of a television, a laptop computer, a monitor, a billboard, an Internet-of-Things (IOT) device, a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

3. The electronic of claim 1, wherein along the second direction:
 the non-display sub-region has an outer edge,
 each of the first power path portion and the second power path portion has a width, the first power path portion is closer to the outer edge of the non-display sub-region than the second power path portion, and
 the width of the first power path portion is greater than the width of the second power path portion.

4. The electronic device of claim 1, further comprising a first display power line which is in the display area and connected to the first power line,
wherein
the first power connection portion of the first power line which is in the non-display area extends along the display area along the second direction, and
the first display power line which is in the display area extends along the first direction.

5. The electronic device of claim 1, further comprising:
a touch electrode which is in the display area and senses an external input to the electronic device;
a scan driver which is in the non-display area and provides a scan signal to the scan line; and
within the non-display sub-region, between the first power path portion and the second power path portion along the second direction:
 a touch line connected to the touch electrode, and
 a scan fan-out line connected to the scan driver.

6. The electronic device of claim 5, further comprising:
the touch electrode provided in plural including a first touch electrode and a second touch electrode; and
the touch line provided in plural including a first touch line connected to the first touch electrode and a second touch line connected to the second touch electrode,
wherein within the non-display sub-region, between the first power path portion and the second power path portion, along the second direction, the scan fan-out line is between the first touch line and the second touch line, and
wherein within the non-display sub-region, along the second direction, the first power path portion, the first touch line, the second touch line and the second power path portion are in order.

7. The electronic device of claim 5, further comprising:
a second power line which is in the non-display area and the non-display sub-region and transmits a second power voltage different from the first power voltage to the pixel; and
a data fan-out line which is in the non-display sub-region and connected to the data line which is in the display area,
wherein within the non-display sub-region, the second power path portion of the first power line, the data fan-out line and the second power line are in order along the second direction.

8. The electronic device of claim 1, wherein
the first power line further includes a third power path portion which is spaced apart from the second power path portion along the second direction and connects the first power connection portion and the second power connection portion to each other,
along the second direction, each of the first power path portion, the second power path portion and the third power path portion has a width, and
the width of the first power path portion, the width of the second power path portion, and the width of the third power path portion are different from each other.

9. The electronic device of claim 8, wherein the width of the first power path portion is greater than the width of the second power path portion, and the width of the second power path portion is greater than the width of the third power path portion.

10. The electronic device of claim 8, wherein along the second direction, the non-display sub-region has an outer edge, and within the non-display sub-region, the first power path portion, the second power path portion and the third power path portion are in order along the second direction from the outer edge of the non-display sub-region.

11. The electronic device of claim 9, wherein within the non-display sub-region, along the second direction:

the first power path portion, the second power path portion and the third power path portion are respectively spaced apart from each other by a distance, and the distance between the first power path portion and the second power path portion is smaller than the distance between the second power path portion and the third power path portion.

12. The electronic device of claim 9, further comprising:

a plurality of touch electrodes which are in the display area and senses an external input to the electronic device;

a scan driver which is in the non-display area and provides a scan signal to the scan line;

a second touch electrode among the plurality of touch electrodes;

a second touch line among the plurality of touch lines which is connected to the second touch electrode; and within the non-display sub-region, between the first power path portion and the second power path portion, along the second direction:

a plurality of touch lines including a first touch line connected to a first touch electrode among the plurality of touch electrodes, and a scan fan-out line connected to the scan driver, and wherein within the non-display sub-region, the first power path portion, the first touch line, the scan fan-out line, the second power path portion, the second touch line and the third power path portion are in order along the second direction.

13. The electronic device of claim 1, wherein the pixel includes in order:

an active layer of a thin film transistor;

a first insulating layer on the active layer;

a gate electrode of the thin film transistor which is on the first insulating layer;

a second insulating layer on the gate electrode; and a first anode connection electrode on the second insulating layer and electrically connected to the thin film transistor, and the non-display sub-region includes a bending area at which the electronic device is bendable, and a portion of the second insulating layer, wherein the first power line is on the second insulating layer and in a same material layer as the first anode connection electrode.

14. The electronic device of claim 13, further comprising in order:

the same material layer including the first anode connection electrode and the first power line;

a first organic layer;

a second anode connection electrode connected to the first anode connection electrode;

a second organic layer; and a first power connection line which is in the bending area of the non-display sub-region and from which the first power voltage is received by the first power line.

15. An electronic device comprising:

a display panel for displaying an image, and the display panel comprising:

in a display area:

a scan line;

a data line; and a pixel connected to the scan line and the data line; and in a non-display area adjacent to a side of the display area:

a scan driving circuit which supplies a scan signal to the scan line;

a scan fan-out line connected to the scan driving circuit; and a power line which is connected to the pixel and transmits a power voltage to the pixel, the power line including:

in order from the side of the display area, in a first direction, a first power connection portion and a second power connection portion spaced apart from each other along the first direction; and a first power path portion and a second power path portion between the first power connection portion and the second power connection portion in the first direction, spaced apart from each other along a second direction crossing the first direction and connecting the first power connection portion and the second power connection portion to each other, the first power connection portion and the second power connection portion together with the first power path portion and the second power path portion physically enclosing an enclosed opening in the power line, wherein the scan fan-out line corresponds to the enclosed opening in the power line.

16. The electronic device of claim 15, wherein the display panel is used as a display screen of a television, a laptop computer, a monitor, a billboard, an Internet-of-Things (IOT) device, a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

17. The electronic device of claim 15, further comprising in the non-display area, a data fan-out line connected to the data line, wherein within the non-display area, the power line is spaced apart from the data fan-out line along the first direction.

18. The electronic device of claim 15, further comprising:

in the display area, a touch electrode on the pixel; and in the non-display area, a touch line connected to the touch electrode, wherein within the non-display area, the touch line corresponds to the enclosed opening between the first power path portion and the second power path portion of the power line.

19. An electronic device comprising:

a display panel for displaying an image, and the display panel comprising:

a display area including a pixel which receives a power voltage, a non-display area adjacent to a side of the display area,
a non-display sub-region; and
a power line which is in the non-display sub-region and
transmits the power voltage to the pixel, the power
line including:
in order from the side of the display area, in a first
direction, a first power connection portion and a
second power connection portion spaced apart
from each other along the first direction; and
a first power path portion and a second power path
portion which are spaced apart from each other
along a second direction crossing the first direc-
tion, and connecting the first power connection
portion and the second power connection portion
to each other,
wherein
the first power path portion and the second power path
portion are disposed between the first power con-
nection portion and the second power connection
portion in the first direction, the non-display sub-region has an outer edge extending
along the first direction,
the first power path portion is closer to the outer edge
of the non-display sub-region than the second power
path portion along the second direction,
each of the first power path portion and the second
power path portion has a width along the second
direction, and
the width of the first power path portion along the
second direction is greater than the width of the
second power path portion along the second direc-
tion.

20. The electronic device of claim 19, wherein the display
panel is used as a display screen of a television, a laptop
computer, a monitor, a billboard, an Internet-of-Things
(IOT) device, a mobile phone, a smartphone, a tablet per-
sonal computer (PC), a smart watch, a watch phone, a
mobile communication terminal, an electronic notebook, an
electronic book, a portable multimedia player (PMP), a
navigation device and an ultra-mobile PC (UMPC).

* * * * *